(12) United States Patent
Yu et al.

(10) Patent No.: US 12,389,590 B2
(45) Date of Patent: Aug. 12, 2025

(54) SEMICONDUCTOR DEVICE

(71) Applicant: Samsung Electronics Co., Ltd., Suwon-si (KR)

(72) Inventors: Dongho Yu, Suwon-si (KR); Jieun Lee, Suwon-si (KR); Deoksung Hwang, Suwon-si (KR); Gisung Kim, Seoul (KR); Seungyoung Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 466 days.

(21) Appl. No.: 17/865,497

(22) Filed: Jul. 15, 2022

(65) Prior Publication Data

US 2023/0121734 A1    Apr. 20, 2023

(30) Foreign Application Priority Data

Oct. 19, 2021    (KR) .................. 10-2021-0139079

(51) Int. Cl.
    *H10B 12/00*    (2023.01)
(52) U.S. Cl.
    CPC ....... *H10B 12/315* (2023.02); *H10B 12/0335* (2023.02); *H10B 12/482* (2023.02)
(58) Field of Classification Search
    None
    See application file for complete search history.

(56) References Cited

U.S. PATENT DOCUMENTS

| | | | |
|---|---|---|---|
| 9,165,859 B2 | 10/2015 | Lim et al. | |
| 9,570,316 B2 | 2/2017 | Lee et al. | |
| 9,881,924 B2 | 1/2018 | Wang et al. | |
| 10,037,999 B2 | 7/2018 | Kim et al. | |
| 10,522,548 B2 | 12/2019 | Chun | |
| 10,665,592 B2 | 5/2020 | Song et al. | |
| 11,417,664 B2 | 8/2022 | Kang | |
| 2015/0228574 A1* | 8/2015 | Kim .............. | H10B 12/315 257/773 |
| 2016/0276273 A1 | 9/2016 | Kwon et al. | |
| 2016/0300763 A1 | 10/2016 | Kim et al. | |

(Continued)

FOREIGN PATENT DOCUMENTS

| | | | |
|---|---|---|---|
| KR | 1020190056905 A | 5/2019 | |
| KR | 1020200079366 A | 7/2020 | |

(Continued)

OTHER PUBLICATIONS

Office Action dated May 4, 2023 issued by the Taiwan Intellectual Property Office for Taiwanese Patent Application No. 111127779.

*Primary Examiner* — Steven M Page
(74) *Attorney, Agent, or Firm* — Muir Patent Law, PLLC

(57) ABSTRACT

A semiconductor device may include bit line structures on a substrate, a contact plug structure on the substrate between the bit line structures, and a capacitor electrically connected to the contact plug structure. The contact plug structure may include a first contact plug, a second contact plug, and a third contact plug sequentially stacked. An upper surface of the second contact plug includes an upper recess. The third contact plug may fill the upper recess, and may protrude above the upper recess. An upper surface of the third contact plug may be higher than a top surface of the bit line structures.

20 Claims, 26 Drawing Sheets

(56) References Cited

U.S. PATENT DOCUMENTS

2016/0329337 A1   11/2016  Hwang et al.
2020/0013782 A1    1/2020  Son et al.
2020/0388620 A1* 12/2020  Park ..................... H10B 12/315
2021/0066304 A1    3/2021  Kang et al.

FOREIGN PATENT DOCUMENTS

KR      102198857 B1   1/2021
TW      202133349 A    9/2021

* cited by examiner

FIG. 9
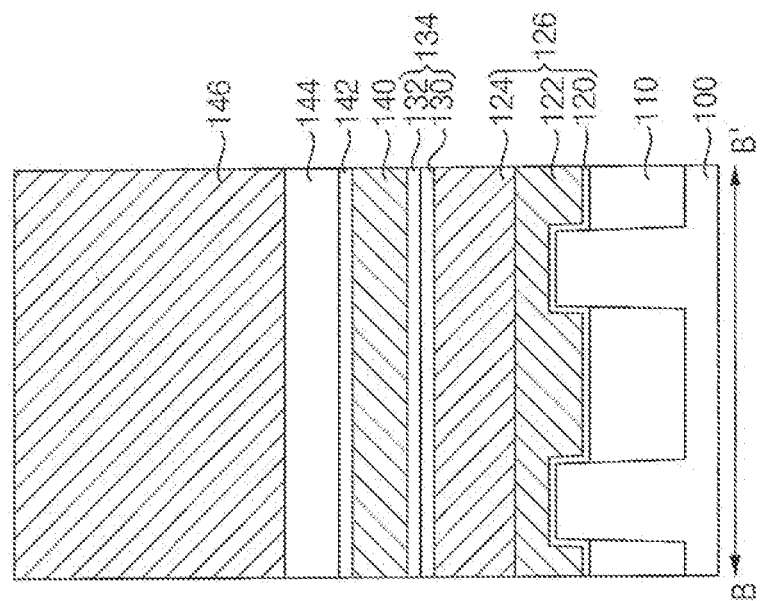
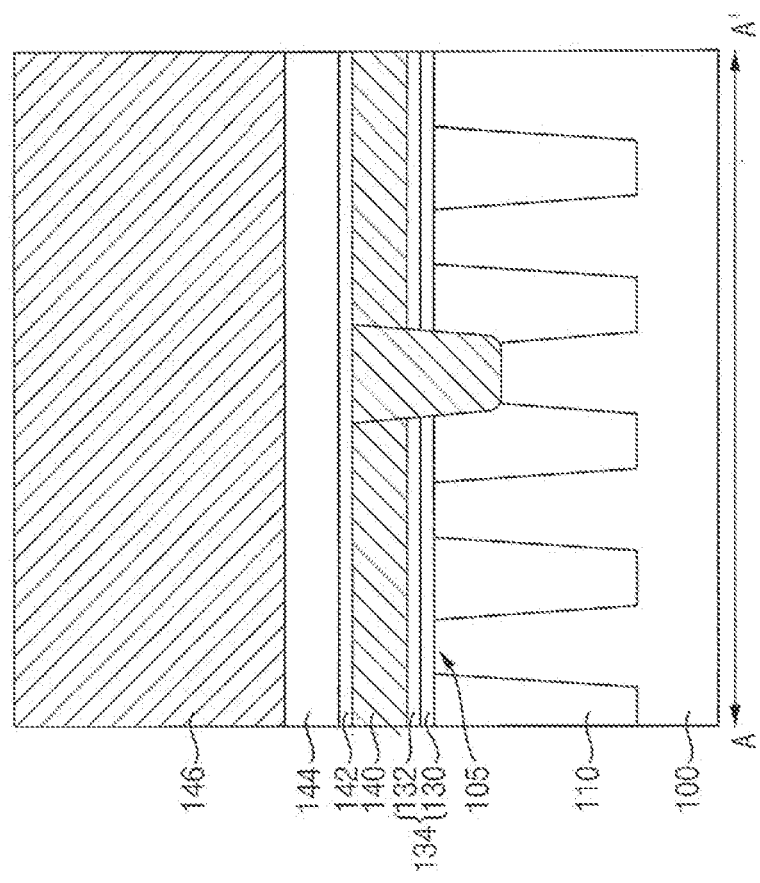

SEMICONDUCTOR DEVICE

CROSS-REFERENCE TO RELATED APPLICATION

This application claims priority under 35 U.S.C. § 119 to Korean Patent Application No. 10-2021-0139079, filed on Oct. 19, 2021, in the Korean Intellectual Property Office (KIPO), the contents of which are incorporated by reference herein in their entirety.

BACKGROUND

1. Field

Embodiments relate to a semiconductor device. More particularly, embodiments relate to a DRAM device.

2. Description of the Related Art

As a dynamic random access memory (DRAM) device is highly integrated, a contact plug structure for electrically connecting a lower impurity region and an upper capacitor may have a high height. Therefore, an upper portion of the contact plug structure may be broken, or a bridge failure between adjacent contact plug structures may occur. Thus, an operation failure of the DRAM device may occur.

SUMMARY

Example embodiments provide a semiconductor device having good characteristics.

Example embodiments provide a method for manufacturing a semiconductor device having good characteristics.

According to example embodiments, there is provided a semiconductor device. The semiconductor device may include bit line structures on a substrate, a contact plug structure on the substrate between the bit line structures, and a capacitor electrically connected to the contact plug structure. The contact plug structure may include a first contact plug, a second contact plug, and a third contact plug sequentially stacked. An upper surface of the second contact plug includes an upper recess. The third contact plug may fill the upper recess, and may protrude above the upper recess. An upper surface of the third contact plug may be higher than a top surface of the bit line structures.

According to example embodiments, there is provided a semiconductor device. The semiconductor device may include bit line structures on a substrate, a contact plug structure on the substrate between the bit line structures, and a capacitor electrically connected to the contact plug structure. The contact plug structure may include a first contact plug including polysilicon, a second contact plug including a metal on the first contact plug, and a third contact plug including a metal on the second contact plug sequentially stacked. A top surface of the second contact plug may be lower than a top surface of the bit line structures. An upper surface of the third contact plug may be higher than the top surface of the bit line structures. A lowermost of the third contact plug may be lower than the top surface of the second contact plug. A first sidewall of the third contact plug may contact a sidewall of a first bit line structure of the bit line structures.

According to example embodiments, there is provided a semiconductor device. The semiconductor device may include a substrate including an active pattern defined by an isolation pattern, gate structures buried in the active pattern and the isolation pattern of the substrate, bit line structures on the substrate, a contact plug structure on the active pattern between the bit line structures, and a capacitor electrically connected to the contact plug structure. The contact plug structure may include a first contact plug including polysilicon, a second contact plug including a metal on the first contact plug, and a third contact plug including a metal on the second contact plug sequentially stacked. The third contact plug may contact a sidewall of a first bit line structure of the bit line structures and a portion of an upper surface of the second contact plug. Both sidewalls of the third contact plug may have slopes different form to each other, in a cross-sectional view.

According to example embodiments, there is provided a method for manufacturing a semiconductor device. In the method, bit line structures may be formed on a substrate. A first contact plug may be formed on the substrate between the bit line structures. A second contact plug may be formed on the first contact plug. A sacrificial insulation layer may cover the bit line structures and the first and second contact plugs. A portion of the sacrificial insulation layer, an upper portion of a first bit line structure of the bit line structures, and an upper portion of the second contact plug may be etched to form an opening. A third contact plug may be formed in the opening. The third contact plug may contact the second contact plug. A capacitor may be formed on the third contact plug. A top surface of the second contact plug may be lower than a top surface of the bit line structures. An upper surface of the third contact plug may be higher than the top surface of the bit line structures.

The semiconductor device in accordance with example embodiments may include the contact plug structure including the first contact plug, the metal silicide pattern, the second contact plug, and the third contact plug sequentially stacked. The contact plug structure may be electrically connected with the impurity region and the capacitor. The third contact plug may contact an upper portion of the second contact plug, the capping pattern in an upper portion of the bit line structure and the spacer structure. A portion of the third contact plug contacting the capping pattern and the spacer structure may have a slope such that a width may be gradually decreased downward of the third contact plug. Thus, an upper width of the third contact plug may be greater than a lower width of the third contact plug. As described above, the upper width of the third contact plug may increase, so that a defect in which an upper portion of the third contact plug is broken may be decreased. In addition, a bottom of the third contact plug may contact only a portion of an upper surface of the second contact plug, so that a gap between upper portions of adjacent contact plug structures may be increased. Therefore, bridge defects between adjacent contact plug structures may be decreased.

Further, in the method of manufacturing the semiconductor device, the third contact plug may be formed by performing a damascene process instead of an embossed patterning process. Accordingly, the upper width of the third contact plug may be sufficiently wide, so that defects due to decreasing of the upper width of the third contact plug may be decreased.

BRIEF DESCRIPTION OF THE DRAWINGS

Example embodiments will be more clearly understood from the following detailed description taken in conjunction with the accompanying drawings in which like numerals refer to like elements throughout. FIGS. 1 to 26 represent non-limiting, example embodiments as described herein.

FIGS. 1 to 3 are cross-sectional views and a plan view illustrating semiconductor devices in accordance with example embodiments; and FIGS. 4 to 26 are cross-sectional views and plan views illustrating a method of manufacturing a semiconductor device in accordance with example embodiments.

DESCRIPTION OF EMBODIMENTS

Figure 1:
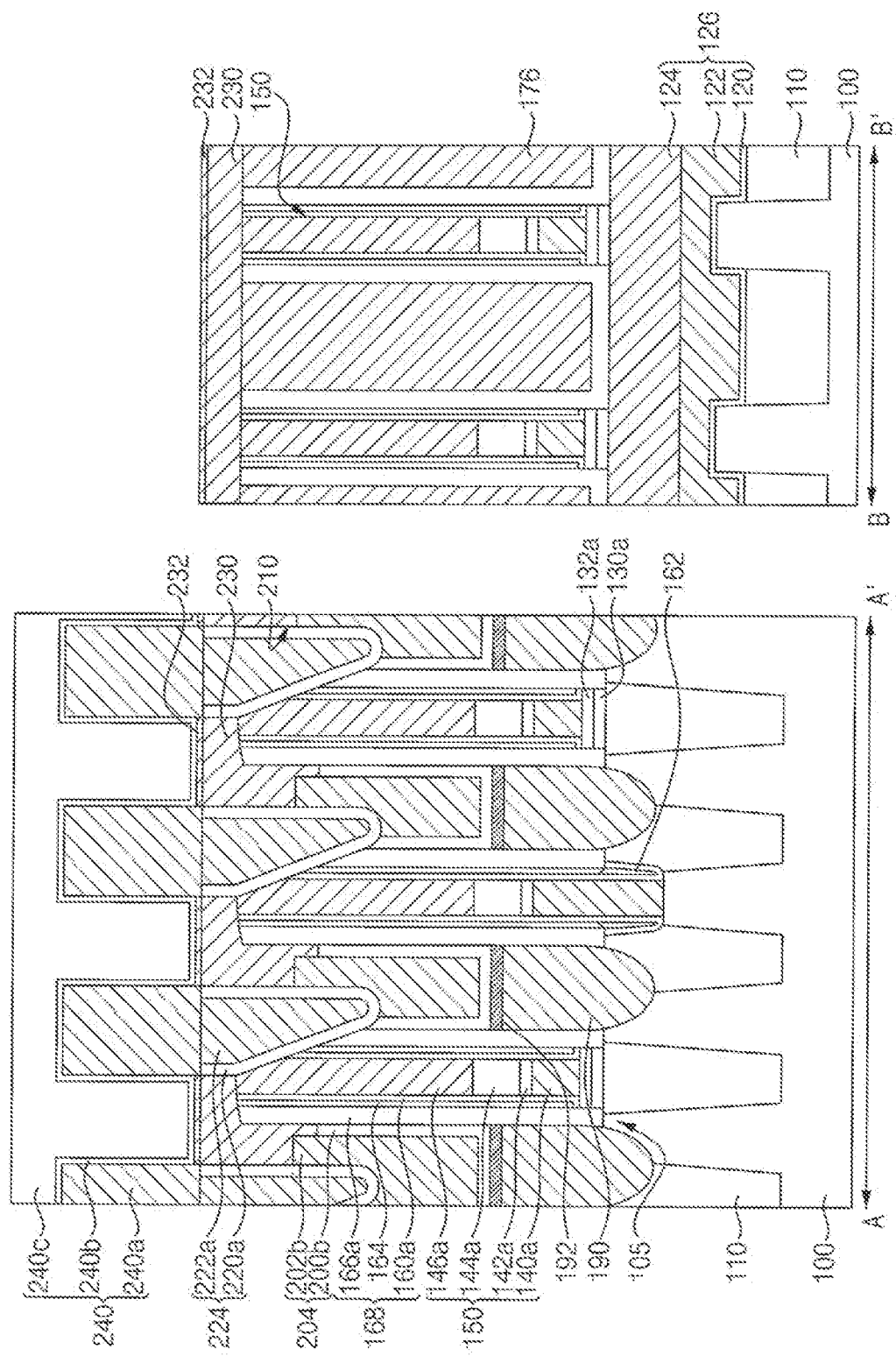
Figure 2:
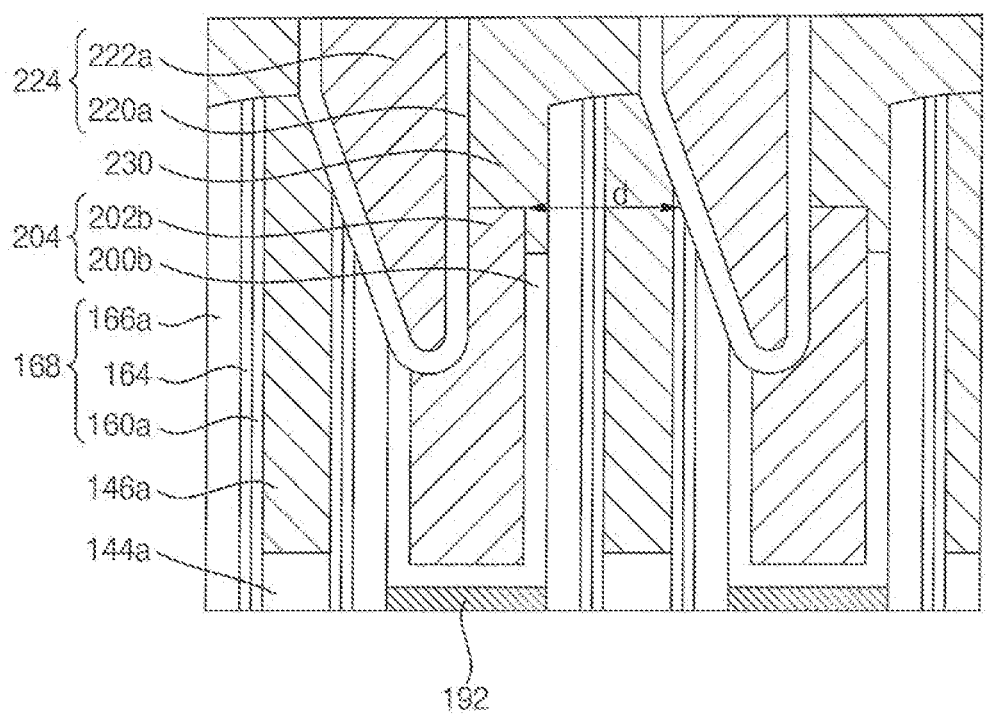

FIGS. 1 and 2 are cross-sectional views illustrating semiconductor devices in accordance with example embodiments. FIG. 2 is a plan view illustrating semiconductor devices in accordance with example embodiments.

Figure 3:
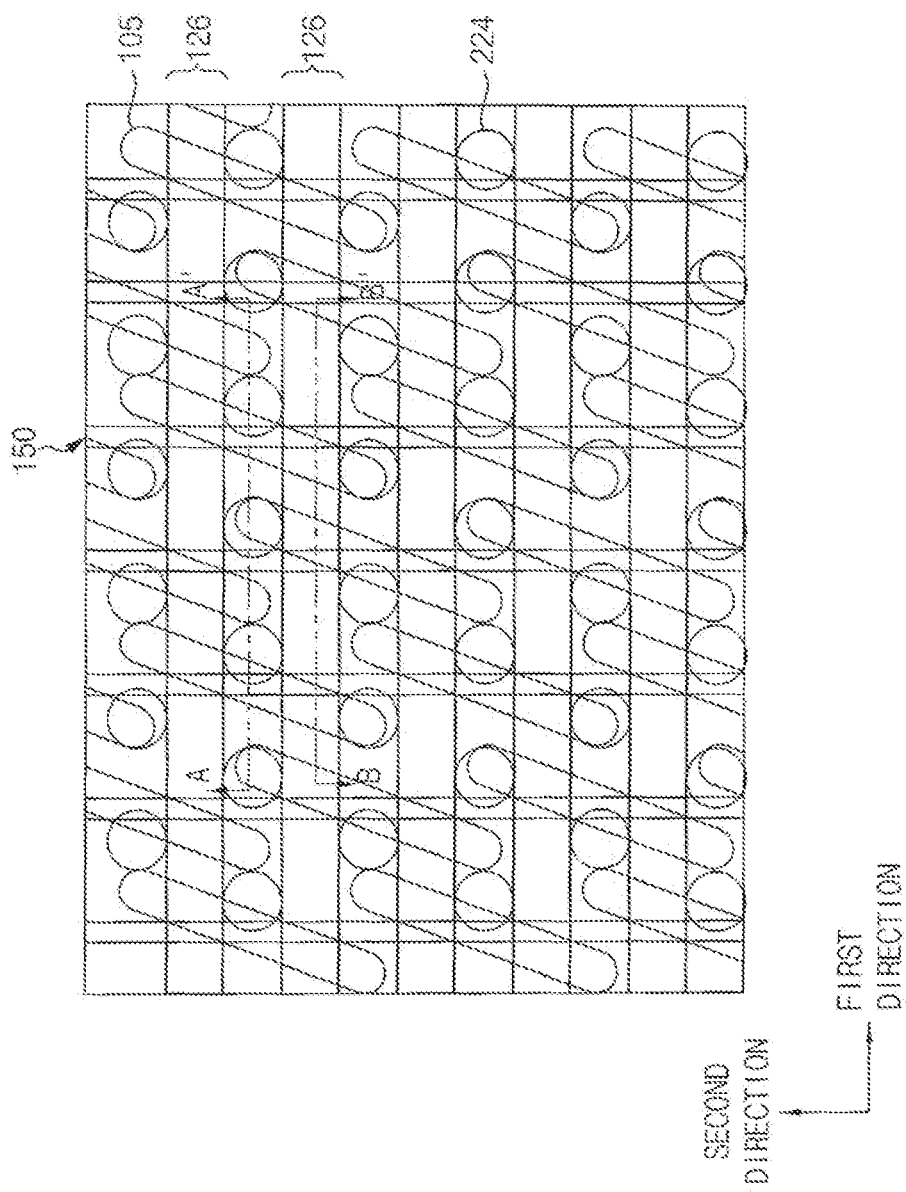

The cross-sectional views of FIG. 1 include cross-sectional views taken along lines A-A' and B-B' in the plan view of FIG. 3. FIG. 2 is an enlarged cross-sectional view of a portion of a contact plug structure in the semiconductor device of FIG. 1.

Referring to FIGS. 1 and 2, the semiconductor device may include a gate structure 126 buried in a substrate 100, and a bit line structure 150, a spacer structure 168, a contact plug structure, and a capacitor 240 formed on the substrate 100. In addition, the semiconductor device may further include first and second insulation patterns 130a and 132a, a lower insulation pattern 162, a fence insulation pattern 176, an etch stop layer 232, and a second insulating interlayer 230. As used herein, the term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

The substrate 100 may include silicon, germanium, silicon-germanium, or a group III-V compound such as GaP, GaAs, or GaSb. In some example embodiments, the substrate 100 may be a silicon-on-insulator (SOI) substrate or a germanium-on-insulator (GOI) substrate.

An isolation pattern 110 may be formed in the substrate 100, and an active pattern 105 having sidewalls surrounded by the isolation pattern 110 may be defined at a surface of the substrate 100. The isolation pattern 110 may include, e.g., an oxide such as silicon oxide.

In example embodiments, a plurality of active patterns 105 may be spaced apart from each other in each of a first direction parallel to an upper surface of the substrate 100 and a second direction perpendicular to the first direction. Each of the active patterns 105 may extend in a third direction having an acute angle with each of the first and second directions and parallel to the upper surface of the substrate 100. Impurity regions (not shown) may be formed at an upper portion of each of the active patterns 105. The impurity regions formed at both end portions in an extending direction of each of the active patterns 105 may be electrically connected to the contact plug structure. The impurity region formed at a central portion in the extending direction of each of the active patterns 105 may be electrically connected to the bit line structure 150.

The gate structure 126 may be formed in a first recess positioned at upper portions of the active pattern 105 and the isolation pattern 110. The gate structure 126 may extend lengthwise in the first direction, and a plurality of gate structures 126 may be spaced apart from each other in the second direction. The gate structure 126 may include a gate insulation layer 120, a gate electrode 122, and a gate mask 124 sequentially stacked in a vertical direction perpendicular to the upper surface of the substrate 100.

The gate insulation layer 120 may be formed on surfaces of the active pattern 105 and the isolation pattern 110, and the gate electrode 122 may be formed on the gate insulation layer 120 so as to extend in the first direction. Also, the gate mask 124 may cover an upper surface of the gate electrode 122. For example, the gate insulation layer 120 may contact surfaces of the active pattern 105 and the isolation pattern 110, the gate electrode 122 may contact an upper surface of the gate insulation layer 120, and the gate mask 124 may contact the upper surface of the gate electrode 122.

The gate insulation layer 120 may include, e.g., an oxide such as silicon oxide, and the gate electrode 122 may include, e.g., a metal such as tungsten (W), titanium (Ti), or tantalum (Ta), or a metal nitride such as tungsten nitride, titanium nitride, or tantalum nitride. The gate mask 124 may include, e.g., a nitride such as silicon nitride.

The bit line structure 150 may include a lower conductive pattern 140a, a first barrier metal pattern 142a, a first metal pattern 144a, and a first capping pattern 146a sequentially stacked in the vertical direction. In example embodiments, the bit line structure 150 may be formed on the active pattern 105, the isolation pattern 110, and the gate structure 126 so as to extend lengthwise in the second direction.

A portion of a lower surface of the lower conductive pattern 140a may be formed in a first opening positioned at an upper surface of the gate mask 124, the upper surface of the active pattern 105, and the upper surface of the isolation pattern 110 adjacent to the active pattern 105.

The lower conductive pattern 140a may include polysilicon doped with impurities. The first barrier metal pattern 142a may include, e.g., a metal such as titanium (Ti) or tantalum (Ta) and/or a metal nitride such as titanium nitride and tantalum nitride, or the first metal pattern 144a may include, e.g., a metal such as tungsten (W). The first capping pattern 146a may include an insulation material. The first capping pattern 146a may include, e.g., a nitride such as silicon nitride.

The spacer structure 168 may be formed on sidewalls of the bit line structure 150, and thus may extend lengthwise in the second direction. The spacer structure 168 may include a first spacer 160a, a second spacer 164, and a third spacer 166a sequentially stacked on the sidewalls of the bit line structure 150.

The first spacer 160a may contact the sidewalls of the bit line structure 150, the second spacer 164 may cover an outer wall of the first spacer 160a, and the third spacer 166a may cover the outer wall of the second spacer 164. In some embodiments, the second spacer 164 may contact the outer wall of the first spacer 160a, and the third spacer 166a may contact the outer wall of the second spacer 164.

In example embodiments, each of the first and third spacers 160a and 166a may include, e.g., a nitride such as silicon nitride, and the second spacer 164 may include, e.g., an oxide such as silicon oxide. In some example embodiments, each of the first and third spacers 160a and 166a may include, e.g., a nitride such as silicon nitride, and the second spacer 164 may be an air spacer including air.

The sidewalls of the bit line structure 150 positioned in the first opening and a surface of the first opening may be covered by the first spacer 160a. The lower insulation pattern 162 may be formed on the first spacer 160a positioned in the first opening to fill the first opening.

Meanwhile, the first and second insulation patterns 130a and 132a may be sequentially stacked on the active pattern 105 and the isolation pattern 110 in which the first opening is not formed. A portion of the bit line structure 150 may be formed on the second insulation pattern 132a.

The first insulation pattern 130a may include, e.g., an oxide such as silicon oxide. The second insulation pattern 132a may include, e.g., a nitride such as silicon nitride.

The fence insulation pattern 176 may be formed on the gate structure 126, and may be disposed between the bit line structures 150. The fence insulation pattern 176 may include, e.g., a nitride such as silicon nitride.

The contact plug structure may include a first contact plug 190, a metal silicide pattern 192, a second contact plug 204, and a third contact plug 224 sequentially stacked in the vertical direction.

The first contact plug 190 may be disposed at a lower portion of a contact hole defined between the bit line structure 150 and the fence insulation pattern 176. The first contact plug 190 may be formed on the active pattern 105 and the isolation pattern 110 adjacent thereto. In example embodiments, a lower surface of the first contact plug 190 may be at a lower vertical level than upper surfaces of the isolation pattern 110 and the substrate 100.

The first contact plug 190 may contact an outer wall of the third spacer 166a. In example embodiments, an upper surface of the first contact plug 190 may be lower than an upper surface of the first metal pattern 144a in the bit line structure 150 and higher than an upper surface of the first barrier metal pattern 142a. The first contact plug 190 may include polysilicon doped with impurities.

The metal silicide pattern 192 may be formed on the upper surface of the first contact plug 190. In some example embodiments, a lower surface of the metal silicide pattern 192 may contact the upper surface of the first contact plug 190. The metal silicide pattern 192 may include, e.g., cobalt silicide, nickel silicide, titanium silicide, or the like. In some example embodiments, the metal silicide pattern 192 may not be formed.

The second contact plug 204 may be formed on the metal silicide pattern 192, and may include, e.g., a metal material. In some example embodiments, a lower surface of the second contact plug 204 may contact an upper surface of the metal silicide pattern 192. In other example embodiments, when the metal silicide pattern 192 is not formed, the lower surface of the second contact plug 204 may contact the upper surface of the first contact plug 190. The second contact plug 204 may include a second barrier metal pattern 200b and a second metal pattern 202b, and the second barrier metal pattern 200b may formed on sidewalls and a bottom of the second metal pattern 202b, contacting the sidewalls and the bottom surface of the second metal pattern 202b.

The second barrier metal pattern 200b may include, e.g., titanium, titanium nitride, tantalum, or tantalum nitride. The second metal pattern 202b may include, e.g., a metal such as tungsten (W), aluminum (Al), or copper. For example, the second metal pattern 202b may include tungsten.

A top surface (e.g., an uppermost surface) of the second barrier metal pattern 200b may be lower than a top surface of the second metal pattern 202b. For example, the second barrier metal pattern 200b may not be formed on an uppermost sidewall of the second metal pattern 202b.

A top surface of the second contact plug 204 may be lower than a top surface of the bit line structure 150.

An upper recess may be included at a portion of an upper surface of the second contact plug 204. In example embodiments, the upper surface of the second contact plug 204 on which the upper recess is not formed may have a relatively high height, and the upper surface of the second contact plug 204 on which the upper recess is formed has a relatively low height. For example, the upper surface of the second contact plug 204 on which the upper recess is formed may have a height that is lower than the height of the second contact plug 204 on which the upper recess is not formed.

In example embodiments, a bottom of the upper recess may be higher than a position of ⅓ of a total height of the second contact plug 204. For example, the bottom of the upper recess may be higher than a position of ½ of the total height of the second contact plug 204.

The second insulating interlayer 230 may be formed on the second contact plug 204, the fence insulation pattern 176, and the bit line structure 150. The second insulating interlayer 230 may contact upper and side surfaces of the second contact plug 204, the fence insulation pattern 176, and the bit line structure 150. The second insulating interlayer 230 may include, e.g., silicon nitride. An upper surface of the second insulating interlayer 230 may be higher than an upper surface of the bit line structure 150. The upper surface of the second insulating interlayer 230 may be substantially flat. For example, the upper surface of the second insulating interlayer 230 may be planar. Terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

A fourth opening 210 may be an etched portion of the second insulating interlayer 230, the first capping pattern 146a of the bit line structure 150, the spacer structure 168, and the second contact plug 204. A lower portion of the fourth opening 210 may correspond to the upper recess.

The fourth opening 210 may include a first sidewall portion exposing the first capping pattern 146a and the spacer structure 168 and a second sidewall portion exposing an upper portion of the second contact plug 204. In the fourth opening 210, the first sidewall portion may have a gentle slope more than the second sidewall portion. For example, a portion of the first sidewall portion may have a slope that is less than 90 degrees with respect to an upper surface of the third metal pattern 222a, and the second sidewall portion may have a slope that is 90 degrees with respect to the upper surface of the third metal pattern 222a. In example embodiments, the slope of the first sidewall portion may be in the range of 40 to 65 degrees with respect to the upper surface of the third metal pattern 222a. Thus, in a portion lower than a top surface of the first capping pattern 146a, an inner width of the fourth opening 210 may gradually decrease downward. Upper portions of the first capping pattern 146a and the spacer structure 168 may have an oblique inclination corresponding to the slope of the first sidewall portion of the fourth opening. For example, the upper portions of the first capping pattern 146a and the spacer structure 168 may have a slope that is greater than 90 degrees with respect to an upper surface of the second insulating interlayer 230. In example embodiments, the upper portions of the first capping pattern 146a and the spacer structure 168 may have a slope that is in the range of 115 to 140 degrees with respect to an upper surface of the second insulating interlayer 230. Accordingly, both upper sidewalls of a structure including the bit line structure 150 and the spacer structure 168 may not have the same slope, in a cross-sectional view.

The third contact plug 224 may be formed at an inner portion of the fourth opening 210. The third contact plug 224 may be formed on the upper recess of the second contact plug 204. The third contact plug 224 may fill the upper recess, and may protrude from an upper portion of the upper recess. The third contact plug 224 may contact the first capping pattern 146a in the bit line structure 150, the surface of the spacer structure 168, and an upper portion of the second contact plug 204. In example embodiments, a lowermost surface of the third contact plug 224 may be higher than a position of ⅓ of the total height of the second contact plug 204. For example, the lowermost surface of the third contact plug 224 may be higher than a position of ½ of the total height of the second contact plug 204.

Both sidewalls of the third contact plug 224 may have slopes different form to each other, in a cross-sectional view. A first sidewall of the third contact plug 224 contacting the first capping pattern 146a and the spacer structure 168 may have a gentle slope more than a second sidewall facing the first sidewall of the third contact plug 224. The first sidewall of the third contact plug 224 contacting the first capping pattern 146a and the spacer structure 168 may have a gentle slope more than a sidewall of the third contact plug 224 contacting the second contact plug 204. For example, the sidewall of the third contact plug 224 contacting the second contact plug 204 may have a vertical slope with respect to an upper surface of the third contact plug 224, and the first sidewall of the third contact plug 224 contacting the first capping pattern 146a and the spacer structure 168 may have an oblique slope. For example, the first sidewall of the third contact plug 224 contacting the first capping pattern 146a and the spacer structure 168 may have a slope that is less than 90 degrees with respect to the upper surface of the third metal pattern 222a, and the sidewall of the third contact plug 224 contacting the second contact plug 204 may have a slope that is 90 degrees with respect to the upper surface of the third metal pattern 222a. In example embodiments, the first sidewall of the third contact plug 224 contacting the first capping pattern 146a and the spacer structure 168 may have a slope that is in the range of 40 to 65 degrees with respect to the upper surface of the third metal pattern 222a. In the position lower than the top surface of the first capping pattern 146a, a width of the third contact plug 224 may gradually decrease downward. Upper sidewalls of the first capping pattern 146a and the spacer structure 168 contacting the third contact plug 224 may have a gentle slope more than opposite upper sidewalls of the first capping pattern 146a and the spacer structure 168.

Accordingly, a distance d between a sloped sidewall of the third contact plug 224 and the second contact plug 204 adjacent thereto may increase. Therefore, a bridge defect between the third contact plug 224 and a contact plug structure adjacent thereto may be decreased.

The third contact plug 224 may include a metal material. The third contact plug 224 may include a third barrier metal pattern 220a and a third metal pattern 222a, and the third barrier metal pattern 220a may be formed on sidewalls and a bottom of the third metal pattern 222a. For example, the third barrier metal pattern 220a may contact the sidewalls and the bottom surface of the third metal pattern 222a. The third barrier metal pattern 220a may be formed on a surface of the upper recess of the second contact plug 204.

The third barrier metal pattern 220a may include, e.g., titanium, titanium nitride, tantalum, or tantalum nitride. The third metal pattern 222a may include, e.g., a metal such as tungsten (W), aluminum (Al), or copper. For example, the third metal pattern 222a may include tungsten.

A top surface of the third contact plug 224 may be higher than a top surface of the bit line structure 150. A lowermost surface of the third contact plug 224 may be lower than the top surface of the second contact plug 204. An upper surface of the third contact plug 224 may be planar. Upper surfaces of the second insulating interlayer 230 and the third contact plug 224 may be coplanar with each other.

In example embodiments, a plurality of third contact plugs 224 may be spaced apart from each other in each of the first and second directions. The third contact plugs 224 may be disposed to have a honeycomb-type arrangement, such that third contact plugs 224 may be disposed at respective vertices and centers of a regular hexagon, in a plan view. An upper surface of each of the third contact plugs 224 may have a circular shape, an oval shape, or a polygonal shape.

The etch stop layer 232 may be formed on the second insulating interlayer 230 and the third contact plug 224. A lower surface of the etch stop layer 232 may contact upper surfaces of the second insulating interlayer 230 and the third contact plug 224.

The capacitor 240 may pass through the etch stop layer 232, and may contact the third contact plug 224. The capacitor 240 may include a lower electrode 240a, a dielectric layer 240b, and an upper electrode 240c sequentially stacked.

The lower electrode 240a and the upper electrode 240c may include, e.g., doped polysilicon, metal nitride, and/or metal. The dielectric layer 240b may include, e.g., an oxide such as silicon oxide or metal oxide and/or a nitride such as silicon nitride. The metal may include aluminum (Al), zirconium (Zr), or titanium (Ti), hafnium (Hf), or the like.

In the semiconductor device, the second contact plug 204 and the third contact plug 224 may be respectively formed by different processes. In the second contact plug 204, the top surface of the second barrier metal pattern 200b may be lower than the top surface of the second metal pattern 202b. Accordingly, bridge defects between adjacent contact plug structures caused by remaining second barrier metal pattern 200b over the second metal pattern 202b may be decreased.

The sidewall of the third contact plug 224 contacting the first capping pattern 146a and the spacer structure 168 may have the oblique slope. The width of the third contact plug 224 may be gradually decreased downward. Accordingly, the distance between the sidewall of the third contact plug 224 contacting the first capping pattern 146a and the spacer structure 168 and the second contact plug 204 adjacent thereto may be increased. Therefore, bridge defects between adjacent contact plug structures may be decreased.

In addition, the third contact plug 224 may maintain a sufficient upper width, so that defects such as a broken upper portion of the third contact plug 224 or increasing of resistance of the third contact plug 224 due to decreasing of the upper width of the third contact plug 224 may be decreased.

FIGS. 4 to 26 are cross-sectional views and plan views illustrating a method of manufacturing a semiconductor device in accordance with example embodiments.

Figure 4:
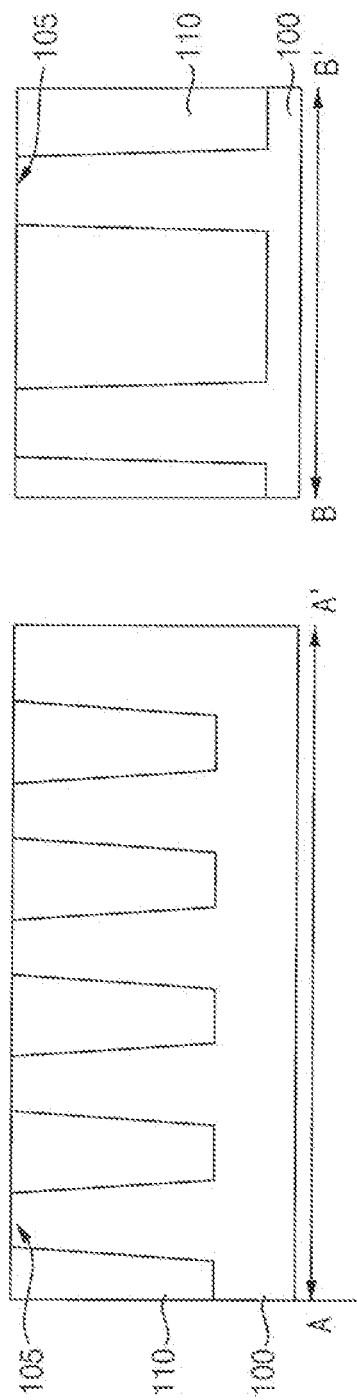
Figure 5:
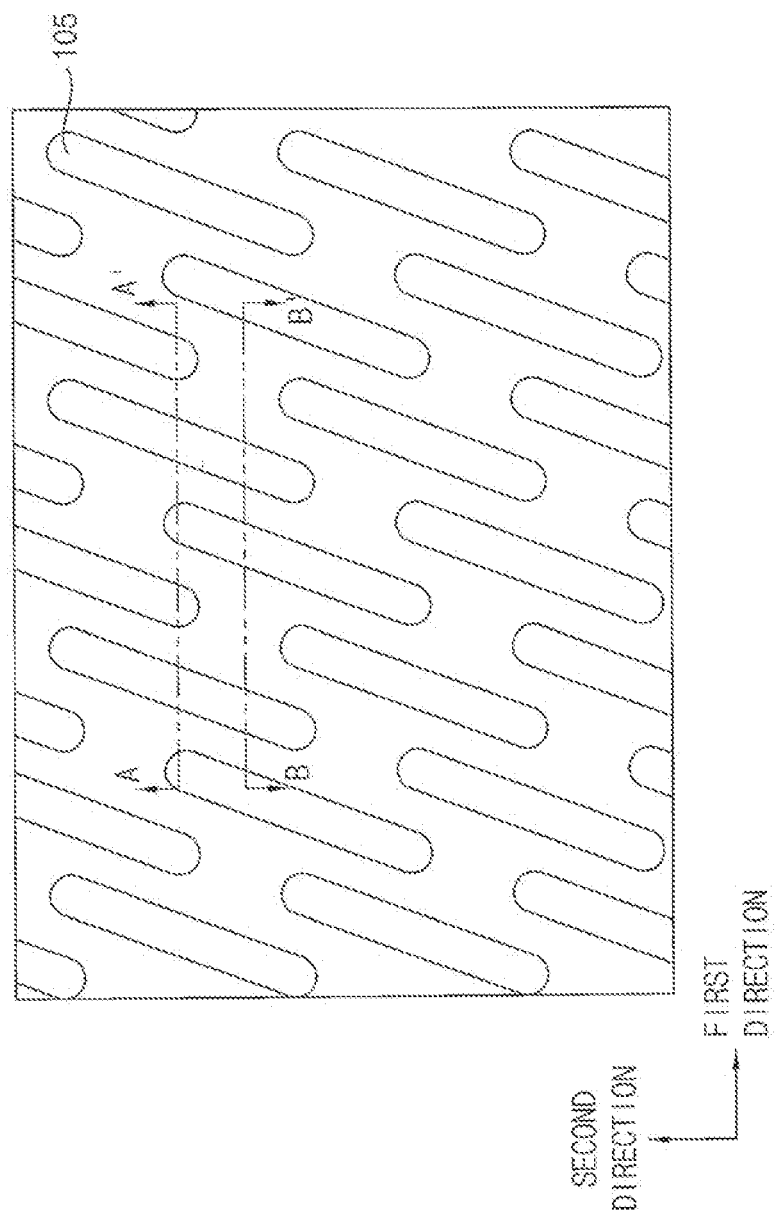
Figure 6:
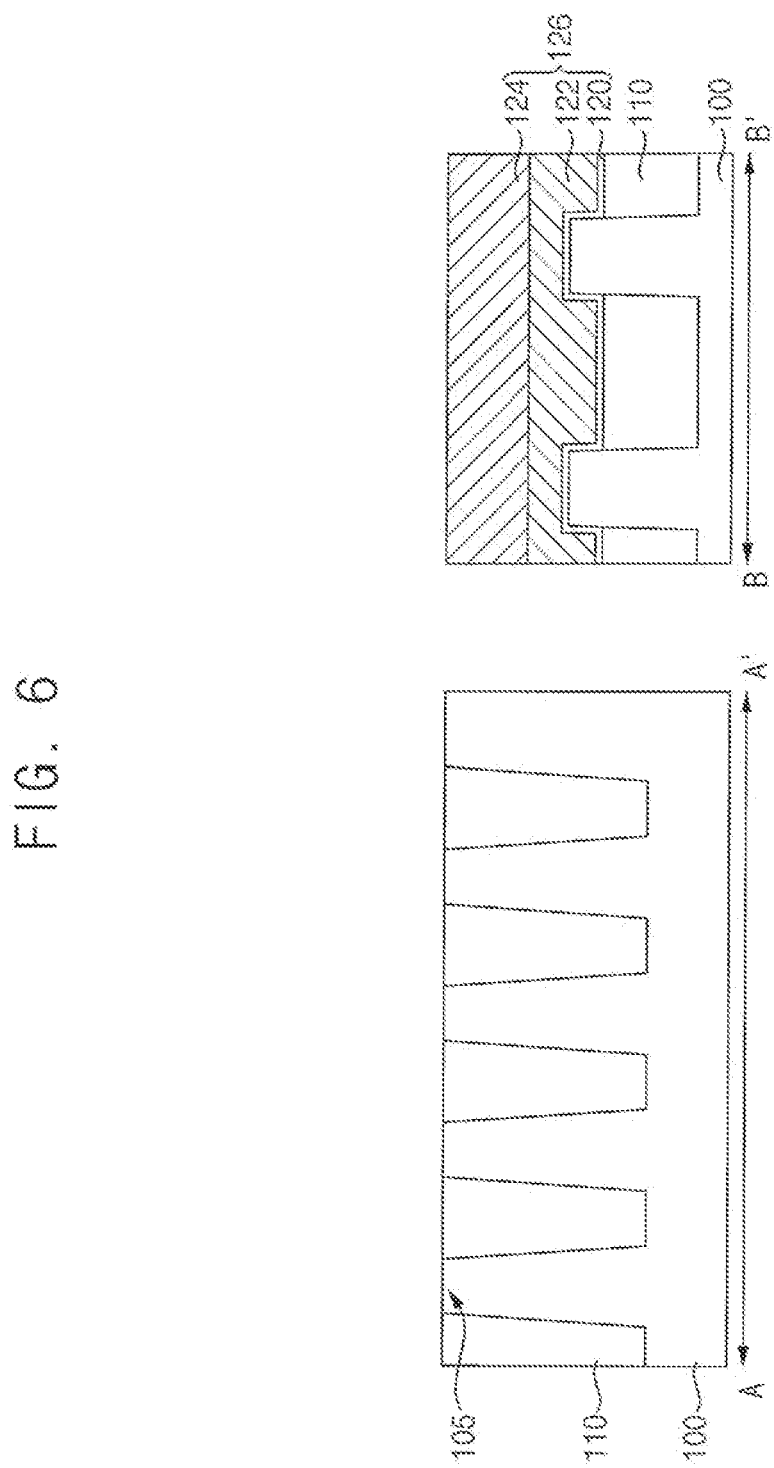
Figure 7:
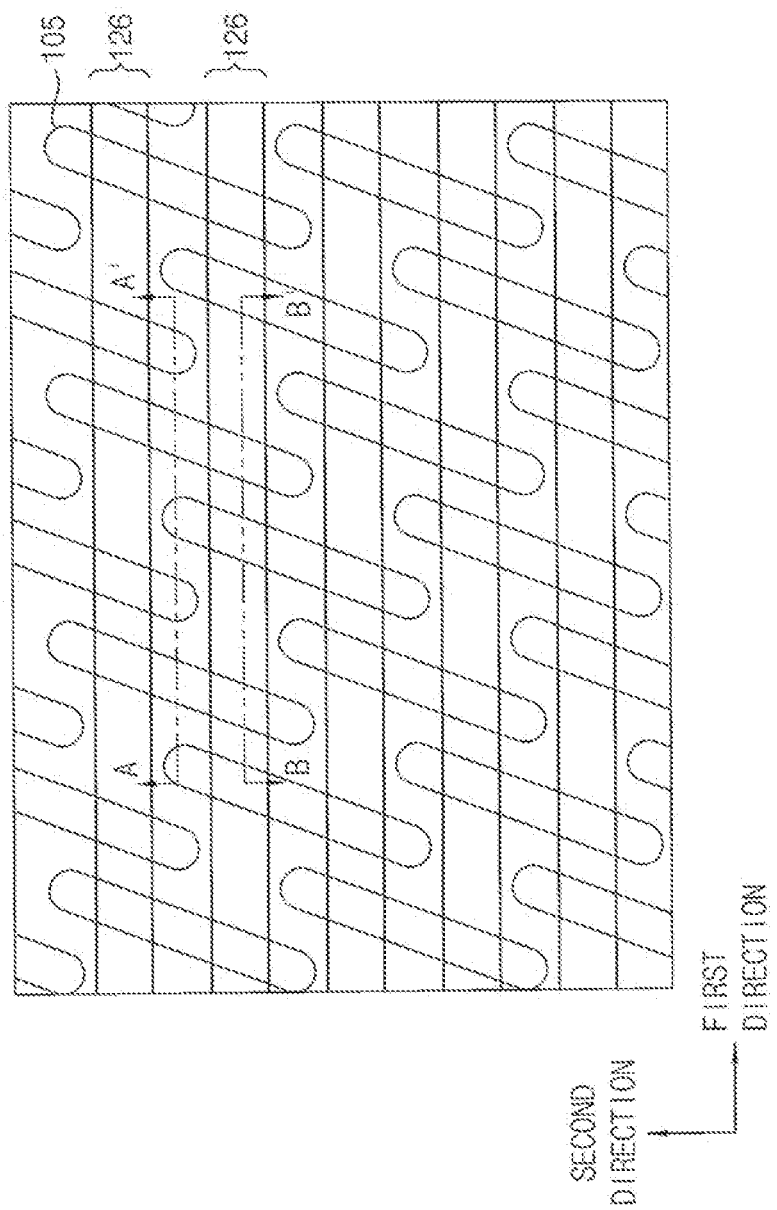
Figure 10:
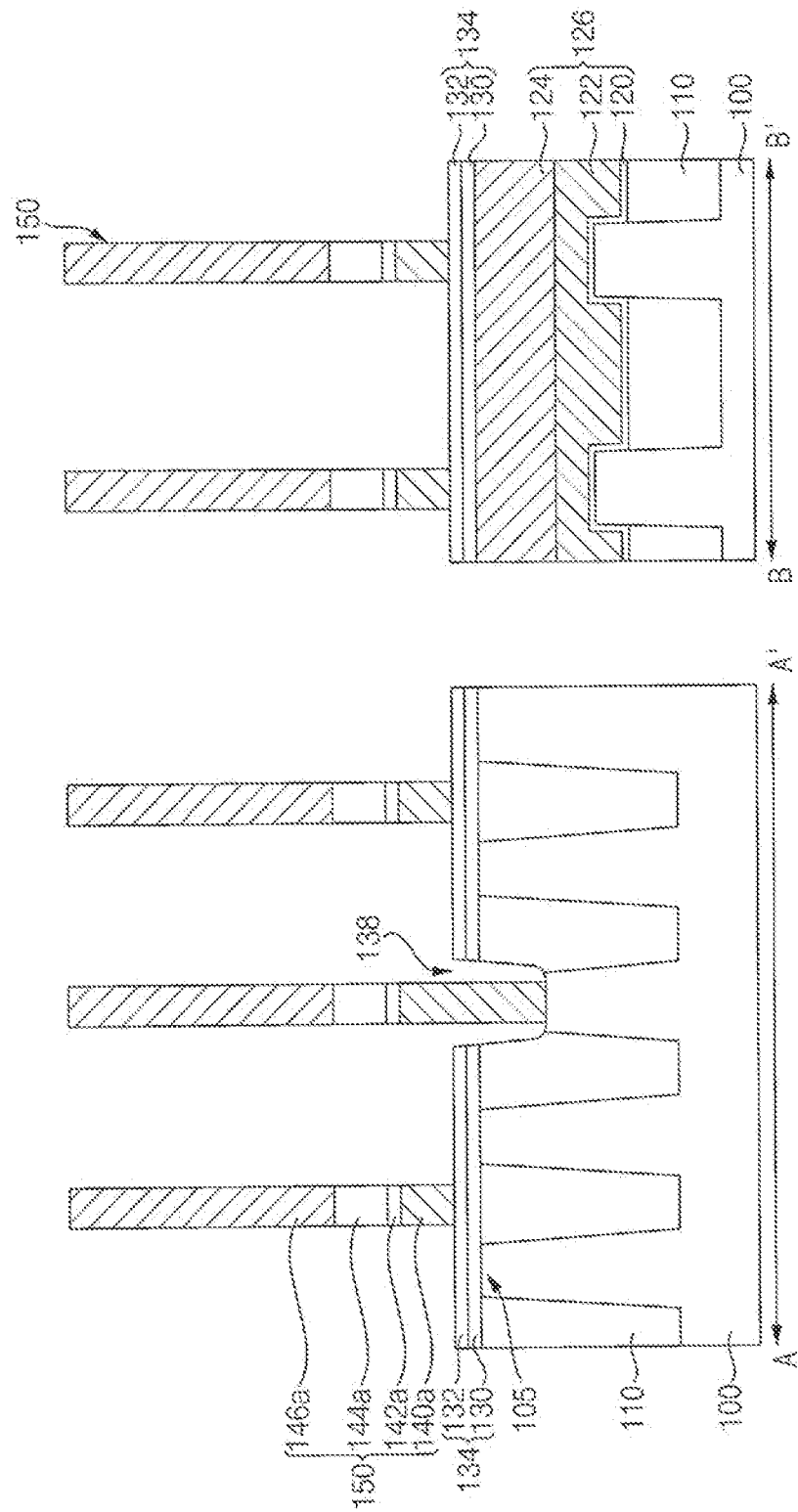
Figure 11:
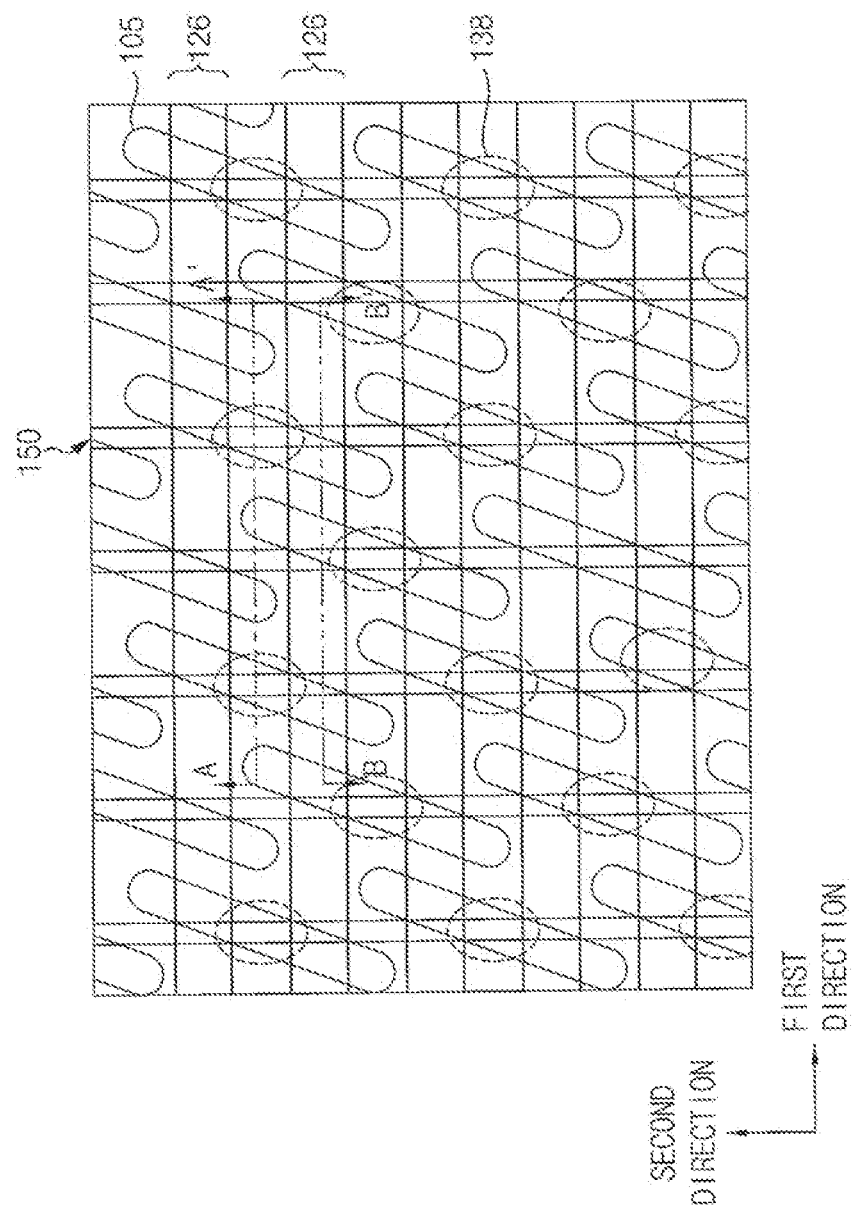

Particularly, FIGS. 5, 7 and 11 are plan views, and FIGS. 4, 6, 8 to 10, and 12 to 26 are cross-sectional views. The cross-sectional views include cross-sections taken along lines A-A' and B-B' of the plan views.

Referring to FIGS. 4 and 5, an active pattern 105 may be formed on a substrate 100. An isolation pattern 110 covering a sidewall of the active pattern 105 may be formed on the substrate.

The active pattern 105 may be formed by removing an upper portion of the substrate 100 to form a trench. The isolation pattern 110 may be formed by forming an isolation layer on the substrate 100 to fill the trench on the substrate 100, and then planarizing the isolation layer until an upper surface of the active pattern 105 is exposed. In example embodiments, the planarization process may include a chemical mechanical polishing (CMP) process and/or an etch-back process.

Referring to FIGS. 6 and 7, an impurity region (not shown) may be formed in the substrate 100 by performing, e.g., an ion implantation process. The active pattern 105 and the isolation pattern 110 are partially etched to form a first recess extending in the first direction.

Thereafter, a gate structure 126 may be formed in the first recess. The gate structure 126 may include a gate insulation layer 120, a gate electrode 122, and a gate mask 124 stacked. The gate structure 126 may extend lengthwise in the first direction. The gate structure 126 may include a plurality of gate structures 126, and the plurality of gate structures 126 may be spaced apart from each other in the second direction.

Figure 8:
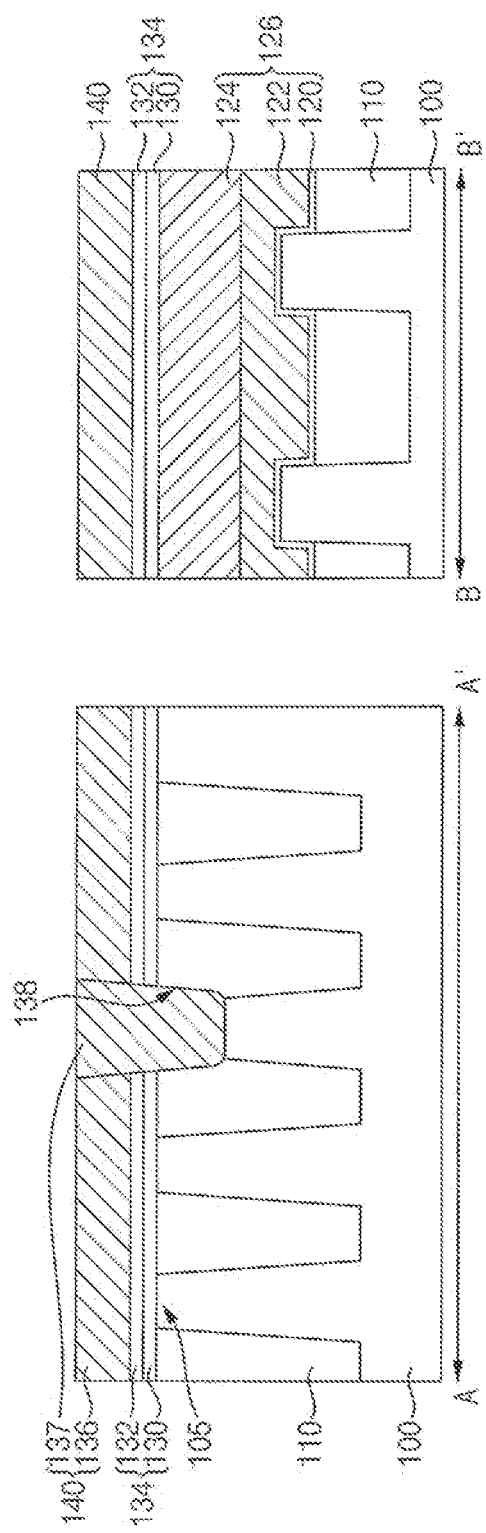

Referring to FIG. 8, an insulation layer structure 134, a first conductive layer 136, and a first etch mask (not shown) may be sequentially formed on the active pattern 105, the isolation pattern 110, and the gate mask 124. The first conductive layer 136, the insulation layer structure 134, and an upper portion of the active pattern may be etched using the first etch mask to form a first opening 138. The active pattern 105 may be exposed by a bottom of the first opening 138.

In example embodiments, the insulation layer structure 134 may include first and second insulation layers 130 and 132 sequentially stacked. The first insulation layer 130 may include, e.g., an oxide such as silicon oxide, and the second insulation layer 132 may include, e.g., a nitride such as silicon nitride.

The first conductive layer 136 may include, e.g., polysilicon doped with impurities, and the first etch mask may include, e.g., a nitride such as silicon nitride.

In example embodiments, the first opening 138 may expose a center portion of the upper surface of each of the active patterns 105 extending in the third direction. A plurality of first openings 138 may be arranged in each of the first and second directions.

Thereafter, a second conductive layer 137 may be formed to fill the first opening 138.

In example embodiments, a preliminary second conductive layer may be formed on the active pattern 105, the isolation pattern 110, and the first conductive layer 136 to fill the first opening 138. An upper portion of the preliminary second conductive layer may be removed by a CMP process and/or an etch-back process. Thus, the second conductive layer 137 may be formed to have an upper surface coplanar with an upper surface of the first conductive layer 136.

In example embodiments, a plurality of second conductive layers 137 may be formed to be spaced apart from each other in each of the first and second directions. The second conductive layer 137 may include, e.g., polysilicon doped with impurities, and thus the second conductive layer 137 may be merged with the first conductive layer 136. Hereinafter, a merged layer including the first conductive layer 136 and the second conductive layer 137 is referred to as a lower conductive layer 140.

Referring to FIG. 9, a first barrier metal layer 142, a first metal layer 144, and a first capping layer 146 may be sequentially formed on the lower conductive layer 140.

The first barrier metal layer 142 may include, e.g., a metal such as titanium (Ti) or tantalum (Ta) and/or a metal nitride such as titanium nitride or tantalum nitride. The first metal layer 144 may include, e.g., a metal such as tungsten (W). The first capping layer 146 may include, e.g., a nitride such as silicon nitride.

Referring to FIGS. 10 and 11, the first capping layer 146 may be patterned to form a first capping pattern 146a. The first metal layer 144, the first barrier metal layer 142, and the lower conductive layer 140 may be sequentially etched using the first capping pattern 146a as an etching mask.

Thus, a lower conductive pattern 140a, a first barrier metal pattern 142a, a first metal pattern 144a, and the first capping pattern 146a may be formed on the second insulation layer and the active pattern 105 in the first opening 138.

A stacked structure including the lower conductive pattern 140a, the first barrier metal pattern 142a, the first metal pattern 144a, and the first capping pattern 146a may serve as the bit line structure 150. The bit line structure 150 may extend lengthwise in the second direction. A plurality of bit line structures 150 may be arranged in the first direction.

Figure 12:
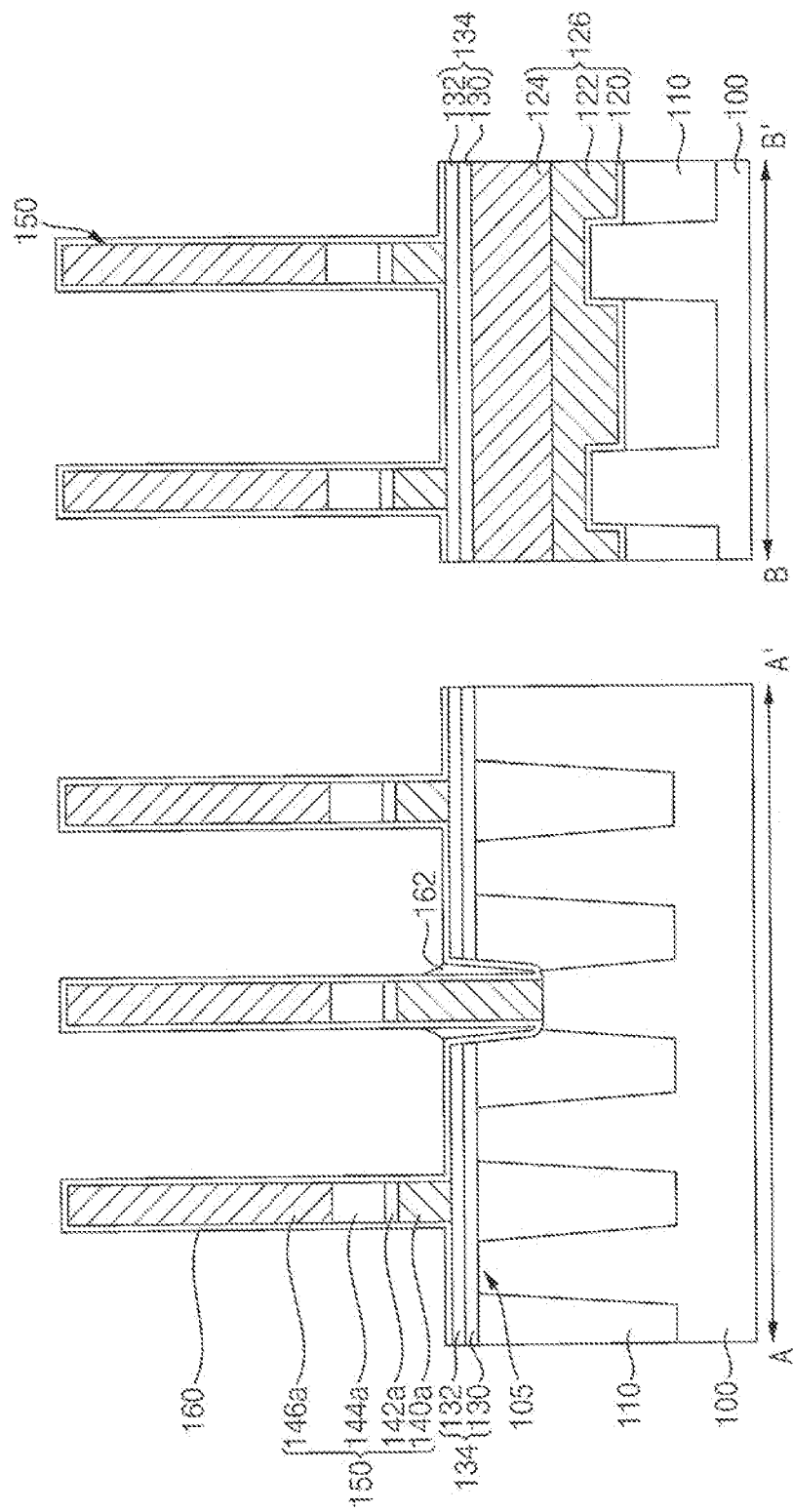

Referring to FIG. 12, a first spacer layer 160 may be formed on a surface of the bit line structure 150, the active pattern 105 and the isolation pattern 110 exposed by the first opening 138, side surfaces of the first insulation layer 130, and side and top surfaces of the second insulation layer 132. The first spacer layer 160 may cover the surface of the bit line structure 150. A lower insulation pattern 162 may be formed on the first spacer layer 160 to fill the first opening 138.

The first spacer layer 160 may include, e.g., a nitride such as silicon nitride.

For forming the lower insulation pattern 162, an insulation layer may be formed on the first spacer layer 160 to fill the first opening 138, and thereafter an etching process of the insulation layer may be performed. In example embodiments, the etching process may include a wet etching process. In the etching process, the insulation layer except a portion formed in the first opening 138 may be mostly removed to form the lower insulation pattern 162.

Figure 13:
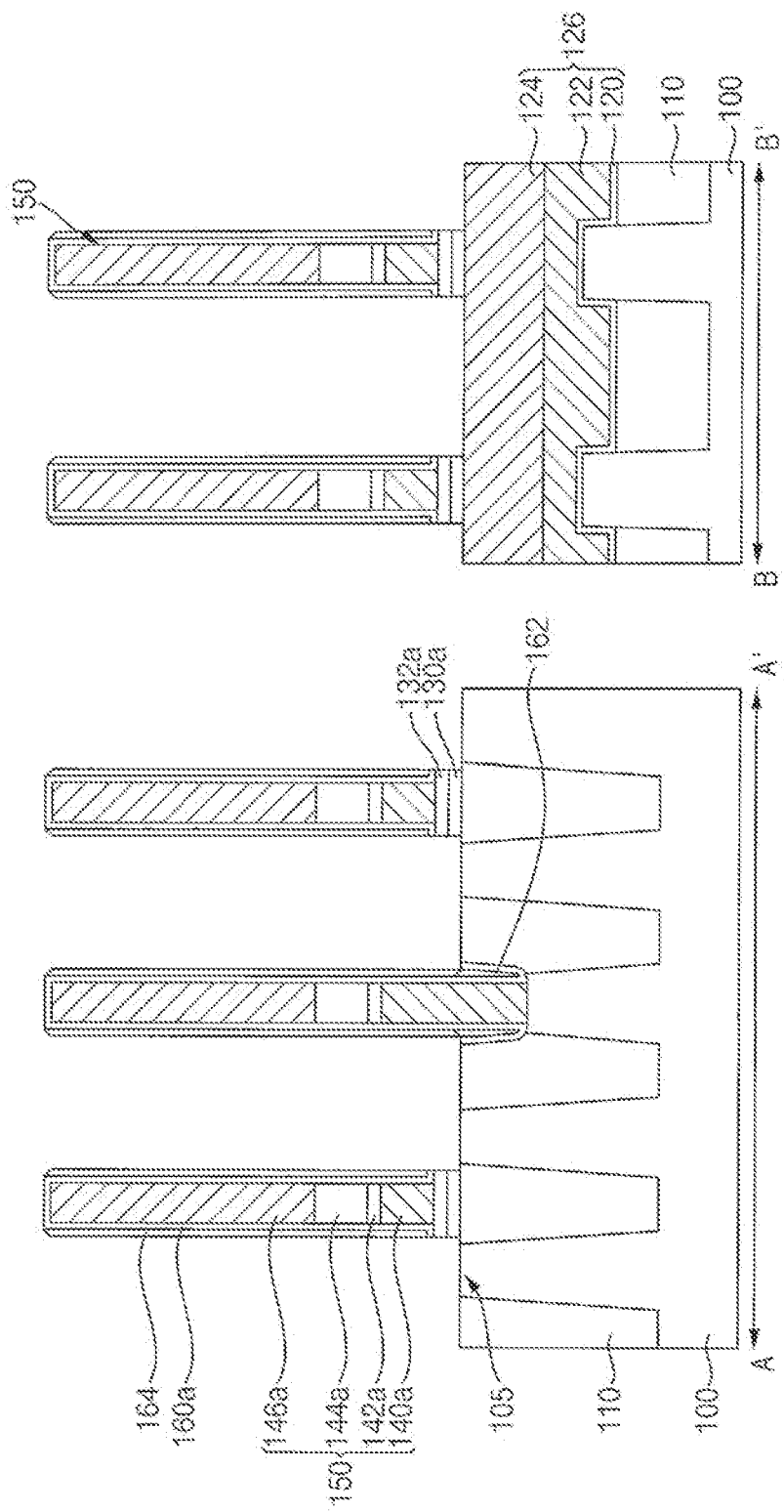

Referring to FIG. 13, a second spacer layer may be formed on the surface of the first spacer layer 160, the lower insulation patterns 162 formed in the first opening 138, and the second insulation layer 132. The second spacer layer may be anisotropically etched to form a second spacer 164 covering sidewalls of the bit line structure 150. The second spacer 164 may be formed on the surface of the first spacer layer 160 and the lower insulation pattern 162.

The second spacer 164 may include, e.g., an oxide such as silicon oxide.

Thereafter, the first spacer layer 160 and the first and second insulation layers 130 and 132 may be etched by a dry etching process using the first capping pattern 146a and the second spacer 164 as an etch mask. Thus, a first spacer 160a may be formed to cover the sidewalls of the bit line structure 150. Also, the first and second insulation layers 130 and 132 are partially etched to form first and second insulation patterns 130a and 132a, respectively.

By the above process, the active pattern 105, the isolation pattern 110, and the gate mask 124 may be exposed at a space between the bit line structures 150.

Figure 14:
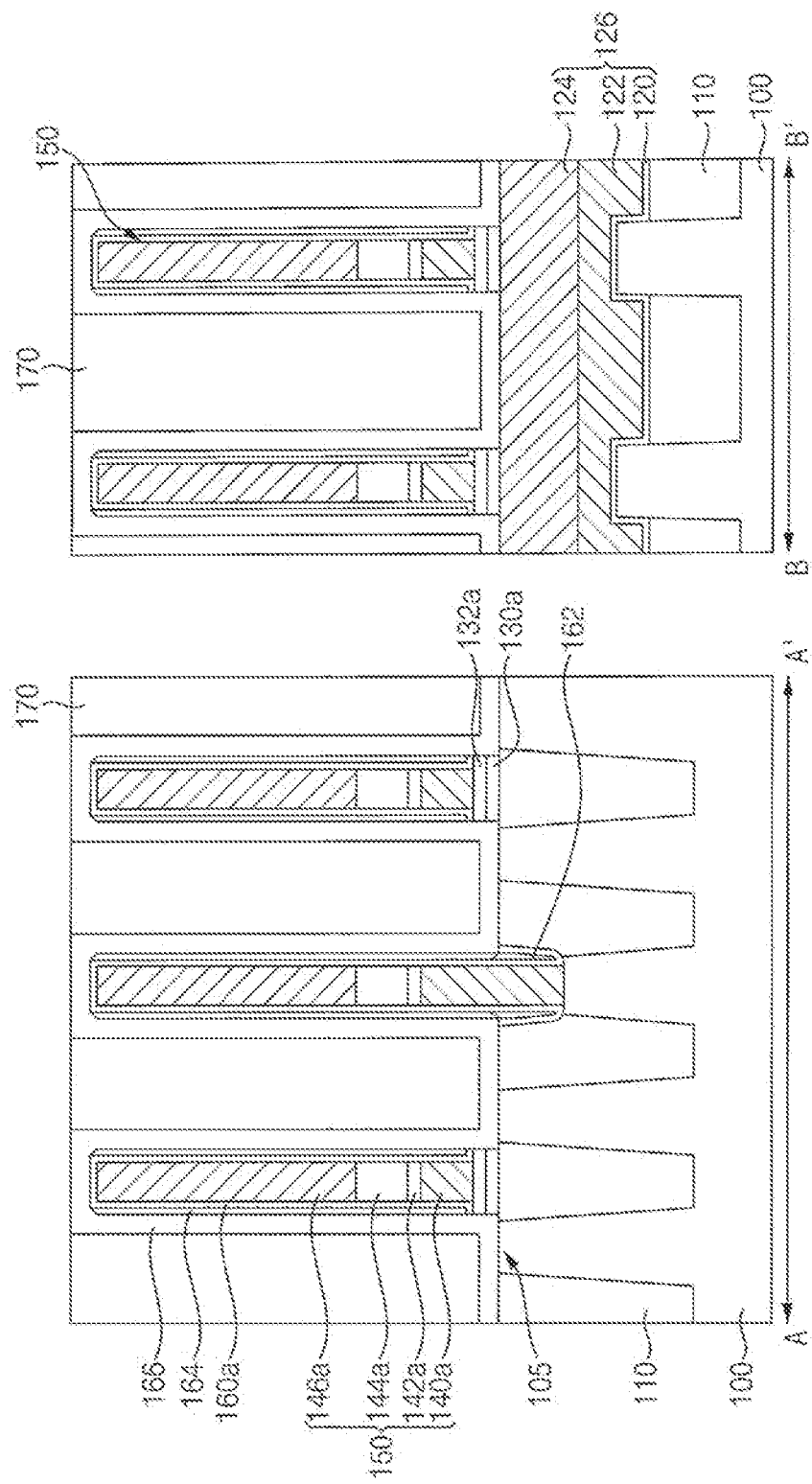

Referring to FIG. 14, a third spacer layer 166 may be formed on the first spacer 160a, the second spacer 164, sidewalls of the first and second insulation patterns 130a and 132a, and upper surfaces of the active pattern 105, the isolation pattern 110, and the gate mask 124.

The third spacer layer 166 may include, e.g., a nitride such as silicon nitride.

After forming the first insulating interlayer 170 on the third spacer layer 166, the first insulating interlayer 170 may be planarized until an upper surface of the third spacer layer 166 is exposed.

The first insulating interlayer 170 may include, e.g., an oxide such as silicon oxide. The planarization process may include a CMP process and/or an etch-back process.

Figure 15:
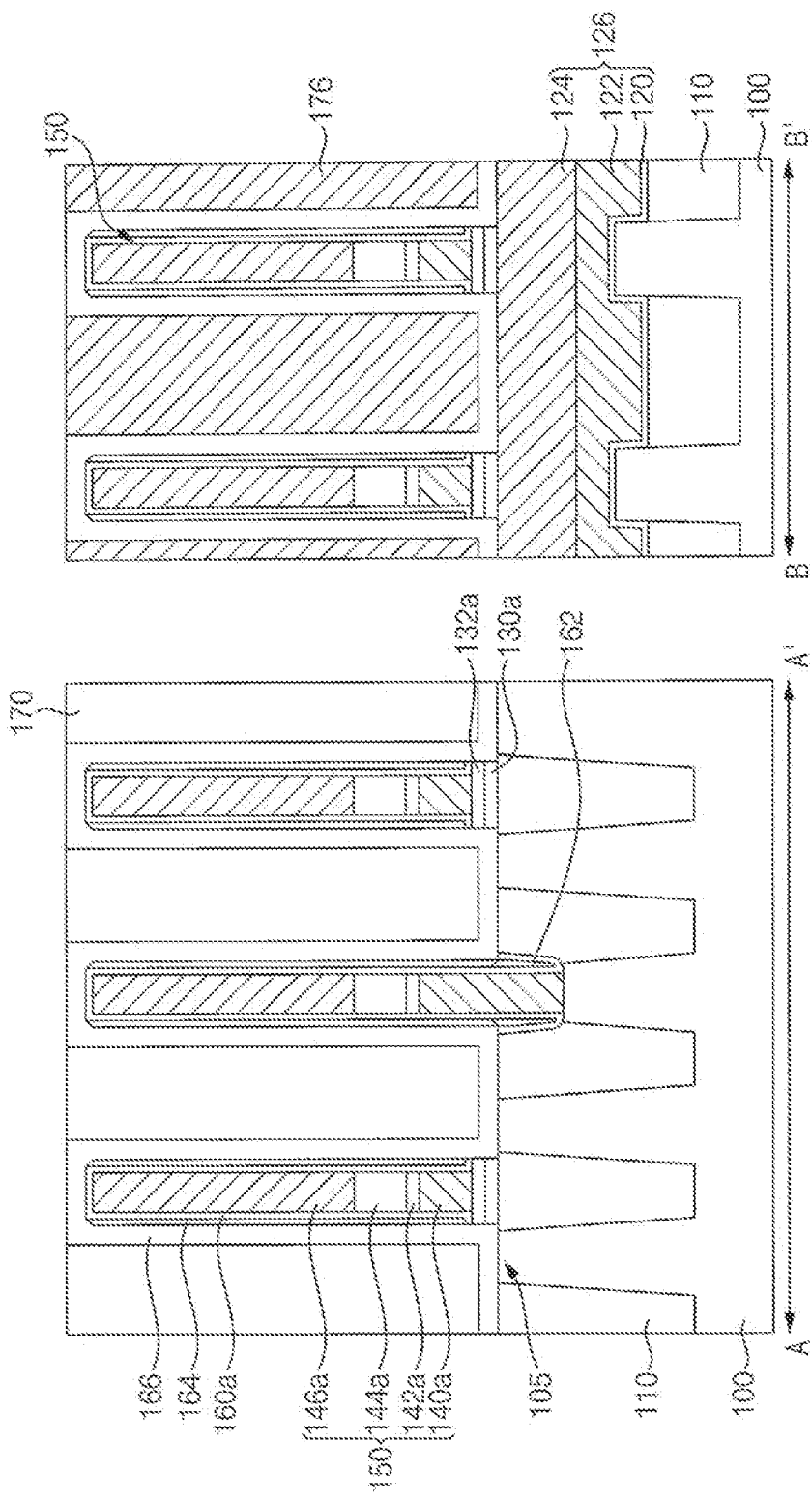

Referring to FIG. 15, a second etching mask (not shown) may be formed on the first insulating interlayer 170 and the third spacer layer 166. The insulating interlayer 170 may be etched by dry etching process using the second etching mask to form a second opening.

In example embodiments, the second etching mask may extend in the first direction, and a plurality of second etching masks may be formed to be spaced apart from each other in the second direction. Each of the second etching masks may not overlap the gate structure 126, and a space between the second etching masks may overlap the gate structure 126. Accordingly, the second opening may be formed to overlap the gate structure 126.

Thereafter, the second etch mask may be removed to expose the upper surface of the first insulating interlayer 170. A fence insulation pattern 176 may be formed to fill the second opening. The fence insulation pattern 176 may include, e.g., a nitride such as silicon nitride.

Figure 16:
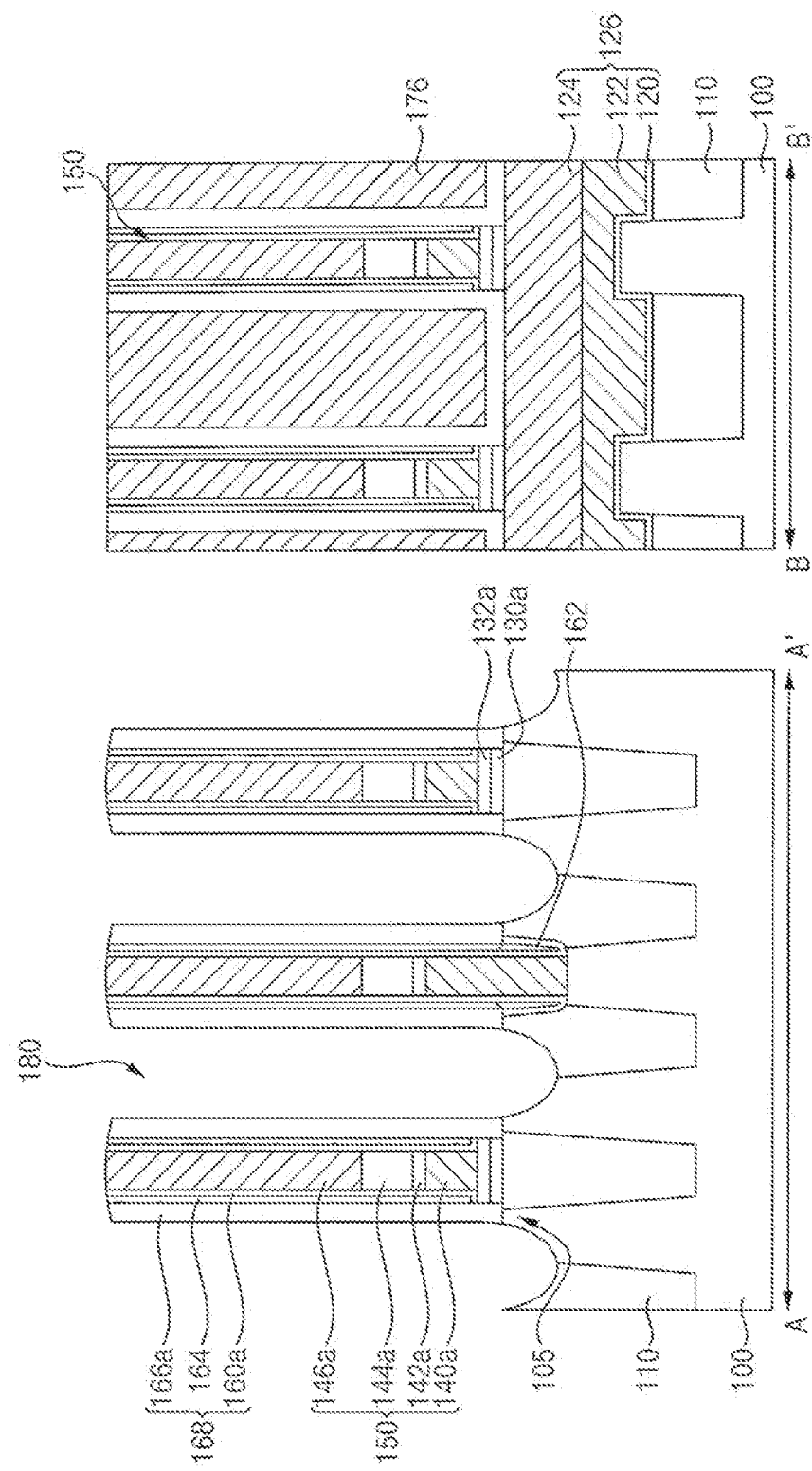

Referring to FIG. 16, the first insulating interlayer 170 may be removed. In example embodiments, the first insulating interlayer 170 may be removed by a wet etching process.

Thereafter, the third spacer layer 166 positioned on spaces between the bit line structures 150 and on the upper surface of the bit line structure 150 may be anisotropically etched to form a third spacer 166a covering the sidewalls of the bit line structure 150. A merged structure including the first to third spacers 160a, 164, and 166a is referred to as a spacer structure 168.

In addition, an upper portion of the active pattern 105 disposed under the third spacer 166a may be etched by a dry etching to form a third opening 180. The third opening 180 may be defined by the bit line structure 150 and the fence insulation pattern 176, and may have an isolated shape. In the dry etching process, an upper portion of the isolation pattern 110 adjacent to an upper portion of the active pattern 105 may also be etched. During the dry etching process, the first to third spacers 160a, 164, and 166a formed on an upper surface of the first capping pattern 146a are also removed, so that the upper surface of the first capping pattern 146a may be exposed.

Figure 17:
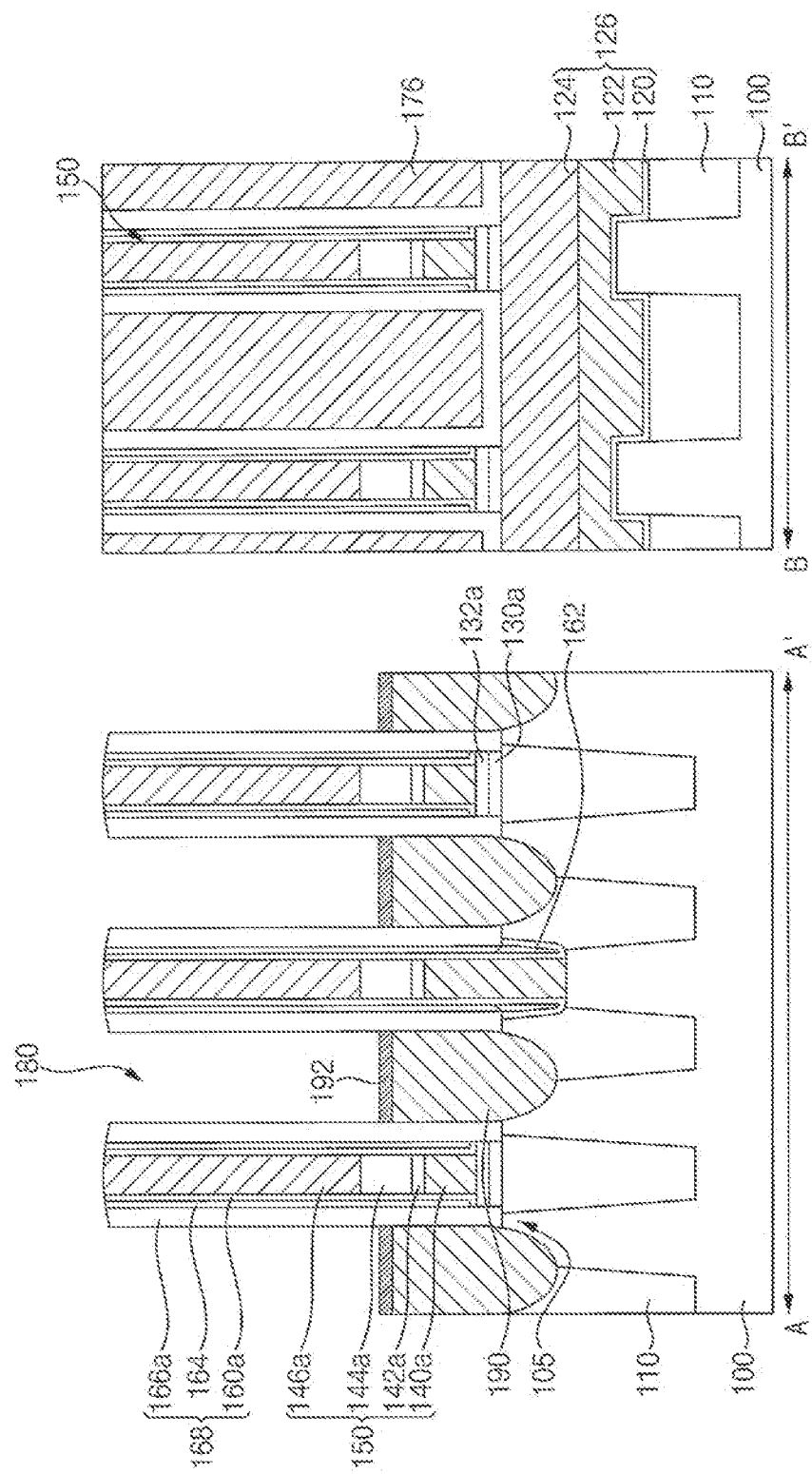

Referring to FIG. 17, a first contact plug 190 may be formed to fill a lower portion of the third opening 180.

Particularly, a fourth conductive layer may be formed on the active pattern 105 and the isolation pattern exposed by the third opening 180, the spacer structure 168, the first capping pattern 146a, and the fence insulation pattern. An upper portion of the fourth conductive layer may be removed to form the first contact plug 190. The upper portion of the fourth conductive layer may be removed by a CMP process and/or an etch-back process.

The first contact plug 190 may include, e.g., polysilicon doped with impurities. In example embodiments, an upper surface of the first contact plug 190 may be lower than an upper surface of the first metal pattern 144a in the bit line structure 150.

Thereafter, a metal silicide pattern 192 may be formed on the upper surface of the first contact plug 190. In example embodiments, an upper surface of the metal silicide pattern 192 may be at a lower level than an upper surface of the first metal pattern 144a in the bit line structure 150. The metal silicide pattern 192 may include, e.g., cobalt silicide, nickel silicide, titanium silicide, or the like. In some example embodiments, a process for forming the metal silicide pattern 192 may be omitted.

Figure 18:
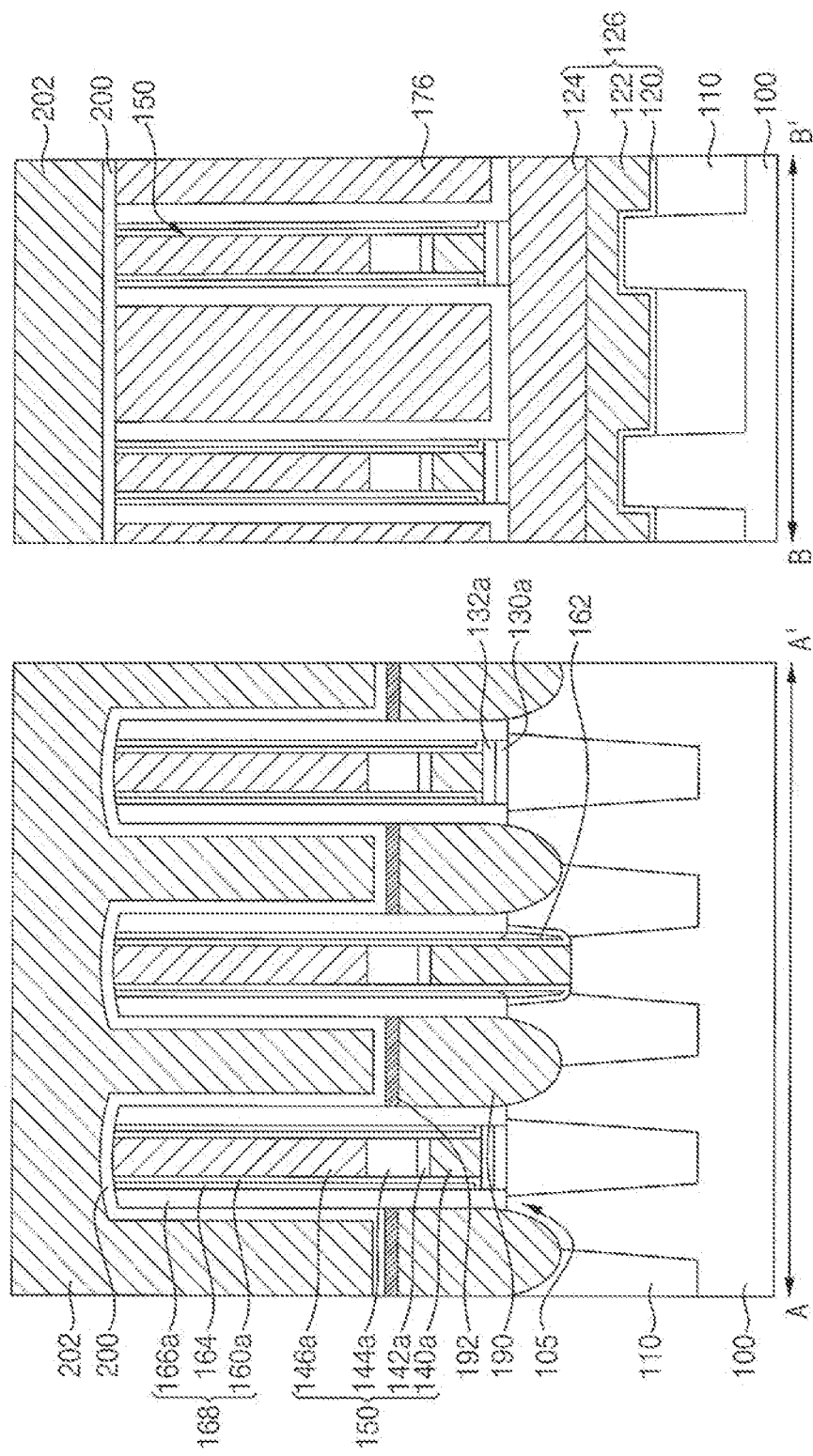

Referring to FIG. 18, a second barrier metal layer 200 may be conformally formed on the metal silicide pattern 192, the spacer structure 168, the first capping pattern 146a, and the fence insulation pattern 176. A second metal layer 202 may be formed on the second barrier metal layer 200.

The second barrier metal layer 200 may include, e.g., titanium, titanium nitride, tantalum, or tantalum nitride. The second metal layer 202 may include, e.g., a metal such as tungsten (W), aluminum (Al), or copper. For example, the second metal layer 202 may include tungsten.

The second metal layer 202 may completely fill a space between the bit line structures, and an upper surface of the second metal layer 202 may be higher than the upper surface of the bit line structure 150.

Figure 19:
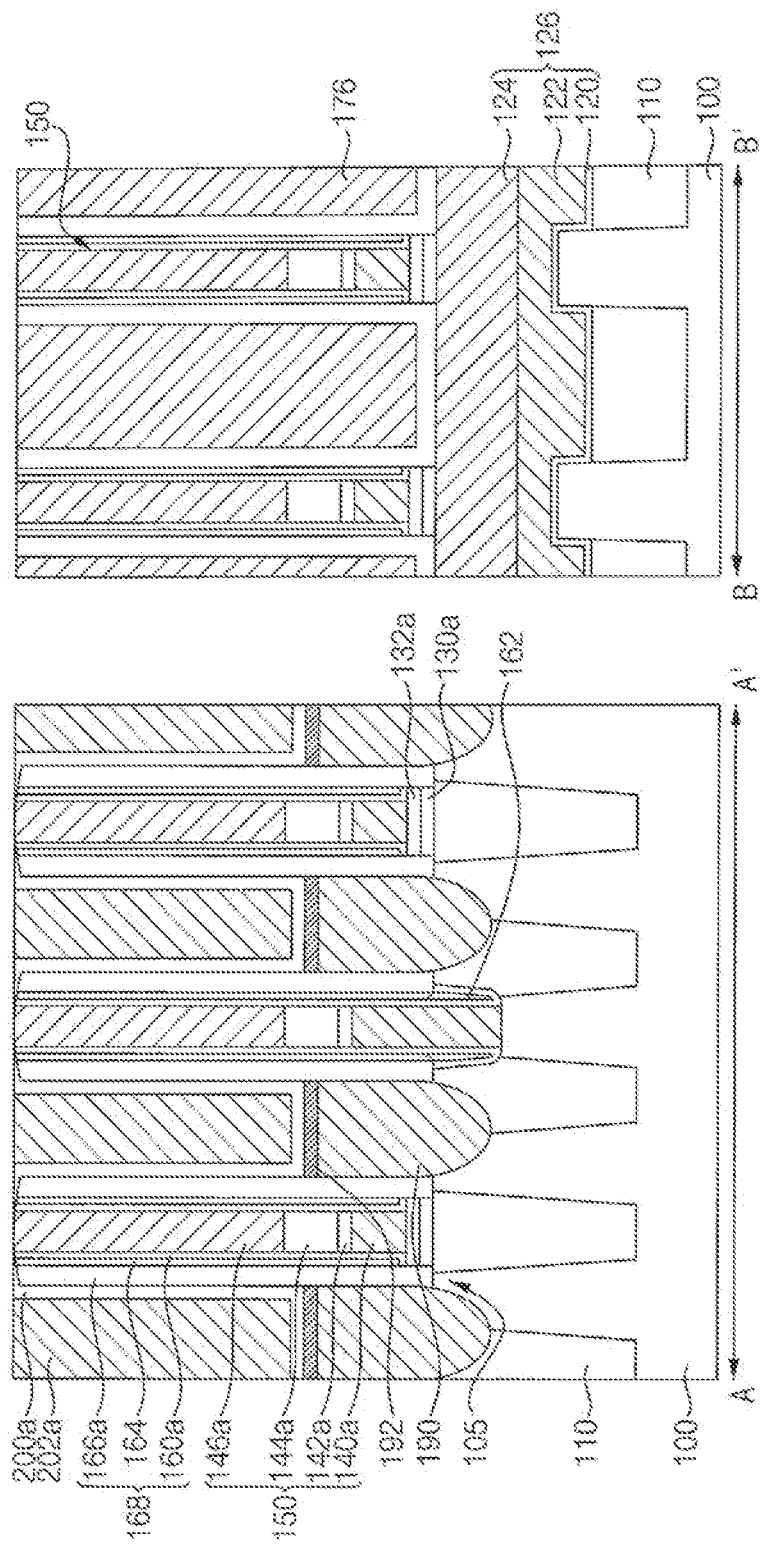

Referring to FIG. 19, the second metal layer 202 and the second barrier metal layer 200 may be planarized until the upper surface of the first capping pattern 146a in the bit line structure 150 is exposed. The planarization process may include a chemical mechanical polishing process.

When the planarization process is performed, each of the second metal layer 202 and the second barrier metal layer 200 may be separated to form a preliminary second metal pattern 202a and a preliminary second barrier metal pattern 200a in the third opening 180.

Figure 20:
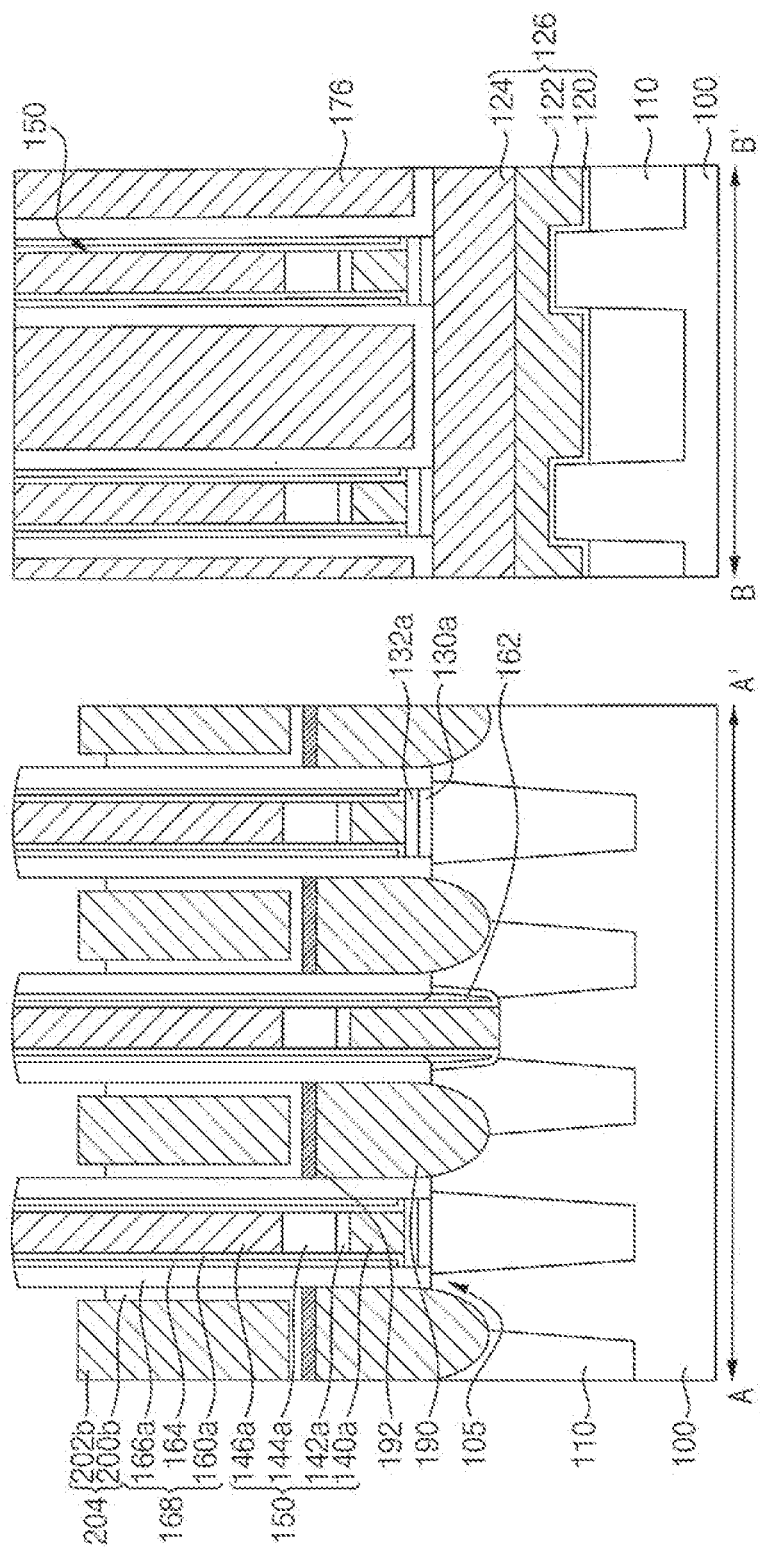

Referring to FIG. 20, upper portions of the preliminary second metal pattern 202a and the preliminary second barrier metal pattern 200a may be removed by an etch-back process to form a second metal pattern 202b. The etch-back process may include a wet etching process.

Thereafter, an upper portion of the preliminary second barrier metal pattern 200a may be further removed to form a second barrier metal pattern 200b. The removing process of the preliminary second barrier metal pattern 200a may include a wet etching process.

Accordingly, a second contact plug 204 including the second barrier metal pattern 200b and the second metal pattern 202b may be formed. A top surface of the second barrier metal pattern 200b may be lower than a top surface of the second metal pattern 202b.

Atop surface of the second contact plug 204 may be lower than a top surface of the bit line structure 150. In the second contact plug 204, the second barrier metal pattern 200b may cover sidewalls and a bottom of the second metal pattern 202b, and the second barrier metal pattern 200b may not be formed on the upper surface of the second metal pattern 202b.

As described above, the removing process of the upper portion of the preliminary second barrier metal pattern 200a may be further performed, so that defects (e.g., bridge defects between adjacent contact plug structures) due to remaining the preliminary second barrier metal pattern 200a over the second metal pattern 202b may be decreased.

In some example embodiments, the second spacer in the spacer structure 168 may be removed to form an air spacer.

Figure 21:
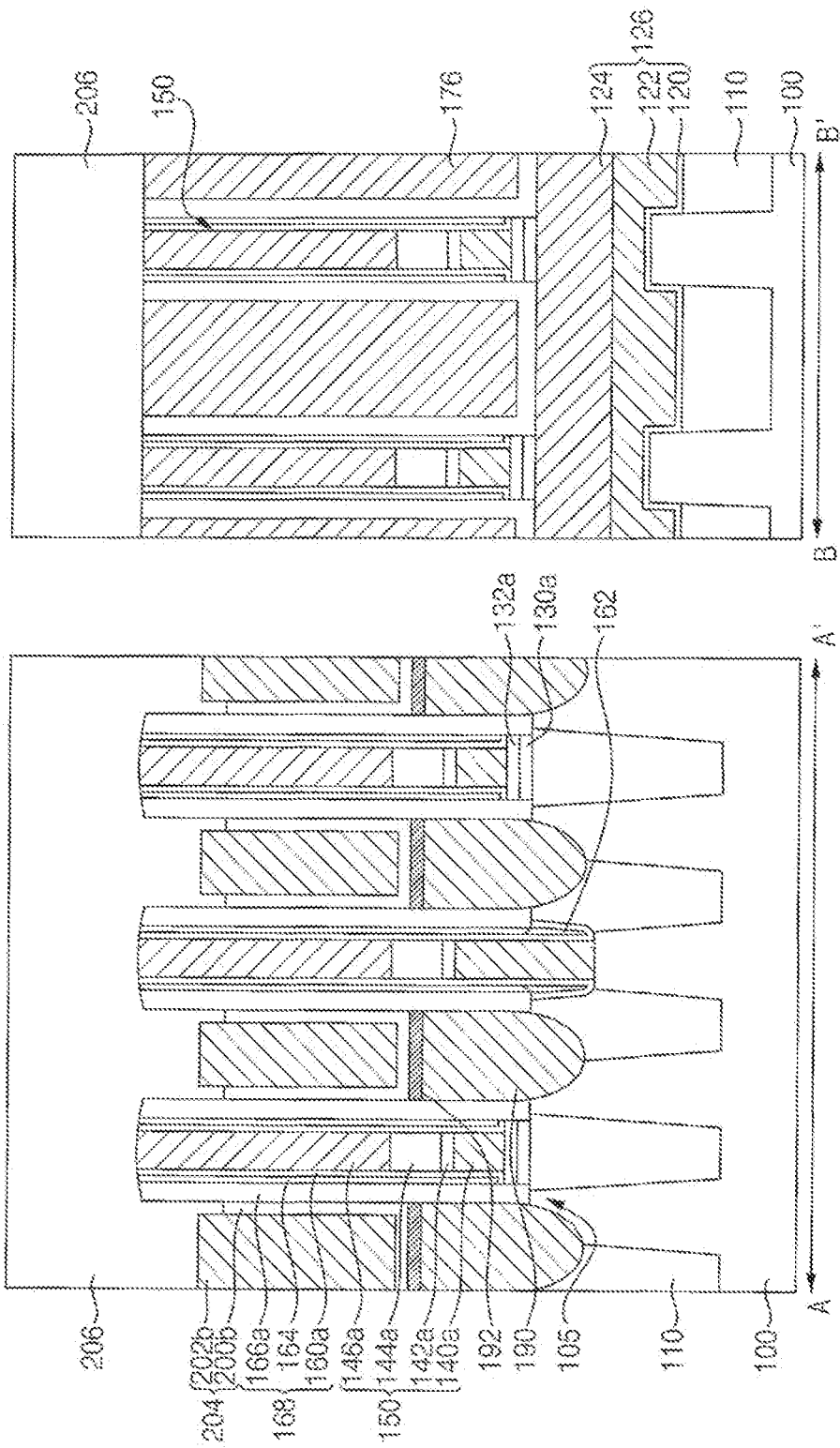

Referring to FIG. 21, a sacrificial insulation layer 206 may be formed on the spacer structure 168, the first capping pattern 146a, the second contact plug 204, and the fence insulation pattern 176 to cover the bit line structure 150.

The sacrificial insulation layer 206 may include silicon oxide. The sacrificial insulation layer 206 may include, e.g., a tetraethyl orthosilicate (TEOS) material.

Figure 22:
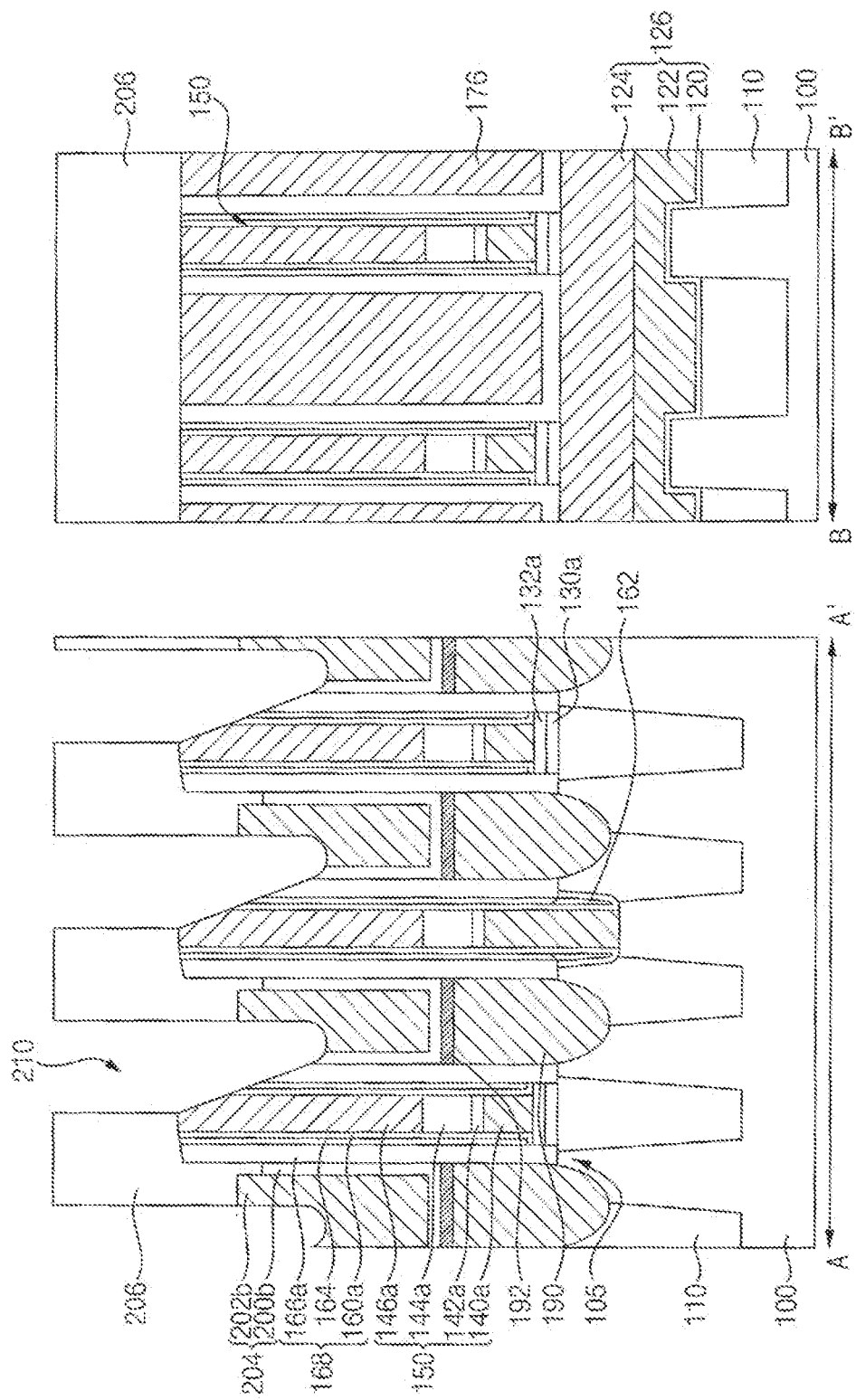

Referring to FIG. 22, a mask pattern (not shown) may be formed on the sacrificial insulation layer 206. The mask pattern may include exposed portions, and each of exposed portions may face a portion of the bit line structure 150 and a portion of the second contact plug 204.

The sacrificial insulation layer 206 may be anisotropically etched using the mask pattern as an etching mask to expose an upper portion of the second contact plug 204. In the anisotropic etching process, upper portions of the first capping pattern 146a in the bit line structure 150 and the spacer structure 168 may be etched together. However, the upper portions of the first capping pattern 146a and the spacer structure 168 may be etched to have an etch rate lower than that of the sacrificial insulation layer 206. Thus, the upper portions of the first capping pattern 146a and the spacer structure 168 may be etched to have a sidewall slope. For example, the upper portions of the first capping pattern 146a and the spacer structure 168 may have a slope that is smaller than opposite upper sidewalls of the first capping pattern 146a and the spacer structure 168.

Thereafter, an exposed upper portion of the second contact plug 204 may be anisotropically etched to form an upper recess. The upper recess may be formed at an upper surface of the second contact plug 204. In the anisotropic etching process, portions of the first capping pattern 146a and the spacer structure 168 may be etched together. However, the first capping pattern 146a and the spacer structure 168 may be etched to have an etch rate lower than that of the sacrificial insulation layer 206. Thus, the upper portions of the first capping pattern 146a and the spacer structure 168 may be etched to have a sidewall slope.

As such, upper portions of the sacrificial insulation layer 206 and the second contact plug 204 may be anisotropically etched to form a fourth opening 210. The sacrificial insulation layer 206, the bit line structure 150, the spacer structure 168, and the second contact plug 204 may be exposed by an inner surface of the fourth opening 210.

A sidewall of the fourth opening 210 exposing the first capping pattern 146a and the spacer structure 168 may have a slope in a direction toward the second contact plug 204. The sidewall of the fourth opening 210 exposing the first capping pattern 146a and the spacer structure 168 may have a gentle slope more than a sidewall of the fourth opening 210 exposing the second contact plug 204. Thus, a distance between the sloped sidewall of the fourth opening 210 and the second contact plug 204 may be increased.

Figure 23:
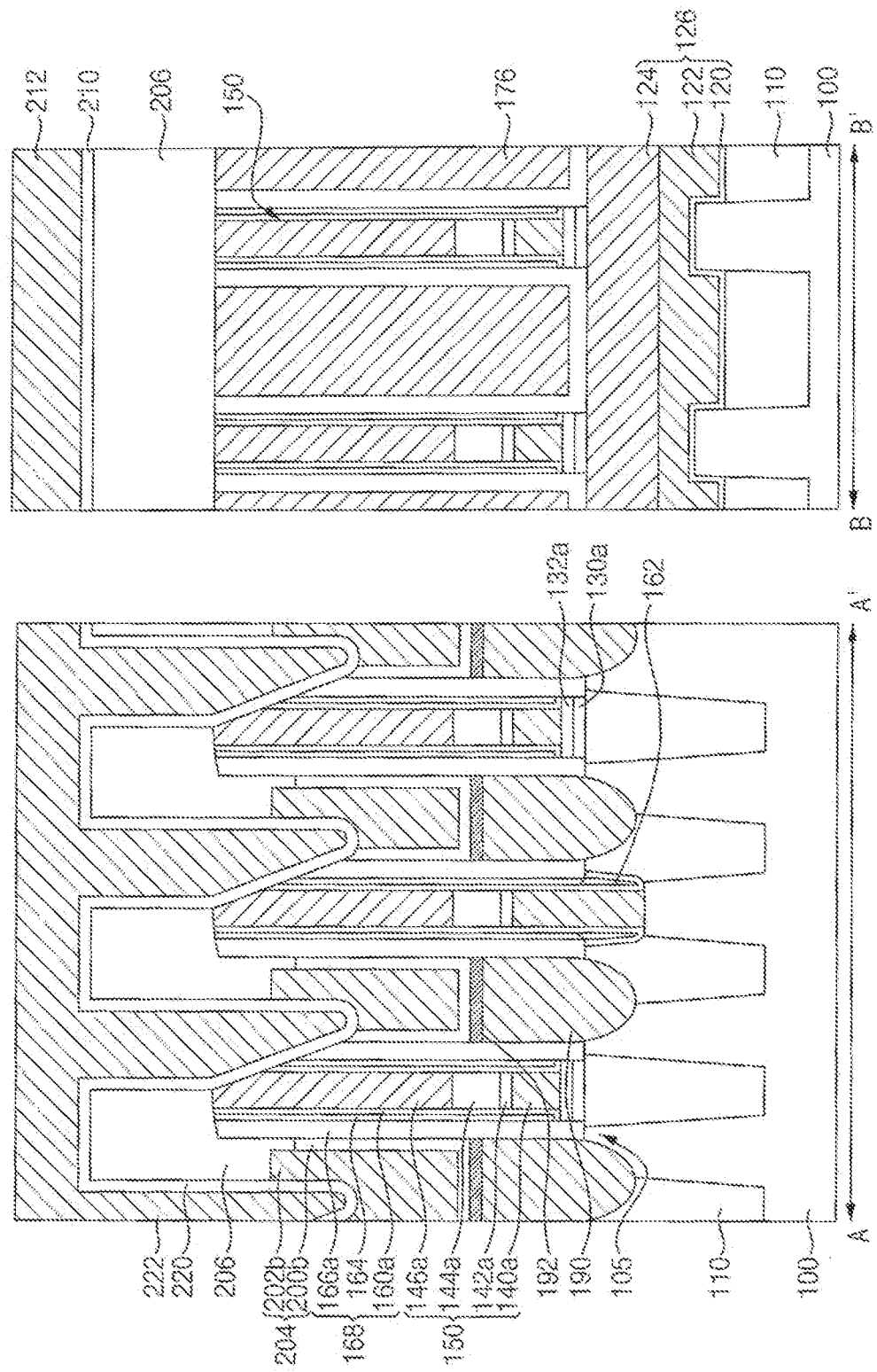

Referring to FIG. 23, a third barrier metal layer 220 may be conformally formed on surfaces of the fourth opening 210 and the sacrificial insulation layer 206. The third barrier metal layer 220 may be formed on the sacrificial insulation layer 206, the bit line structure 150, the spacer structure 168, and the second contact plug 204. A third metal layer 222 may be formed on the third barrier metal layer 220. The third metal layer 222 may be formed to completely fill the fourth opening 210, and an upper surface of the third metal layer 222 may be higher than the top surface of the bit line structure 150.

The third barrier metal layer 220 may include, e.g., titanium, titanium nitride, tantalum, or tantalum nitride. The third metal layer 222 may include, e.g., a metal such as tungsten (W), aluminum (Al), or copper. For example, the third metal layer 222 may include tungsten.

Figure 24:
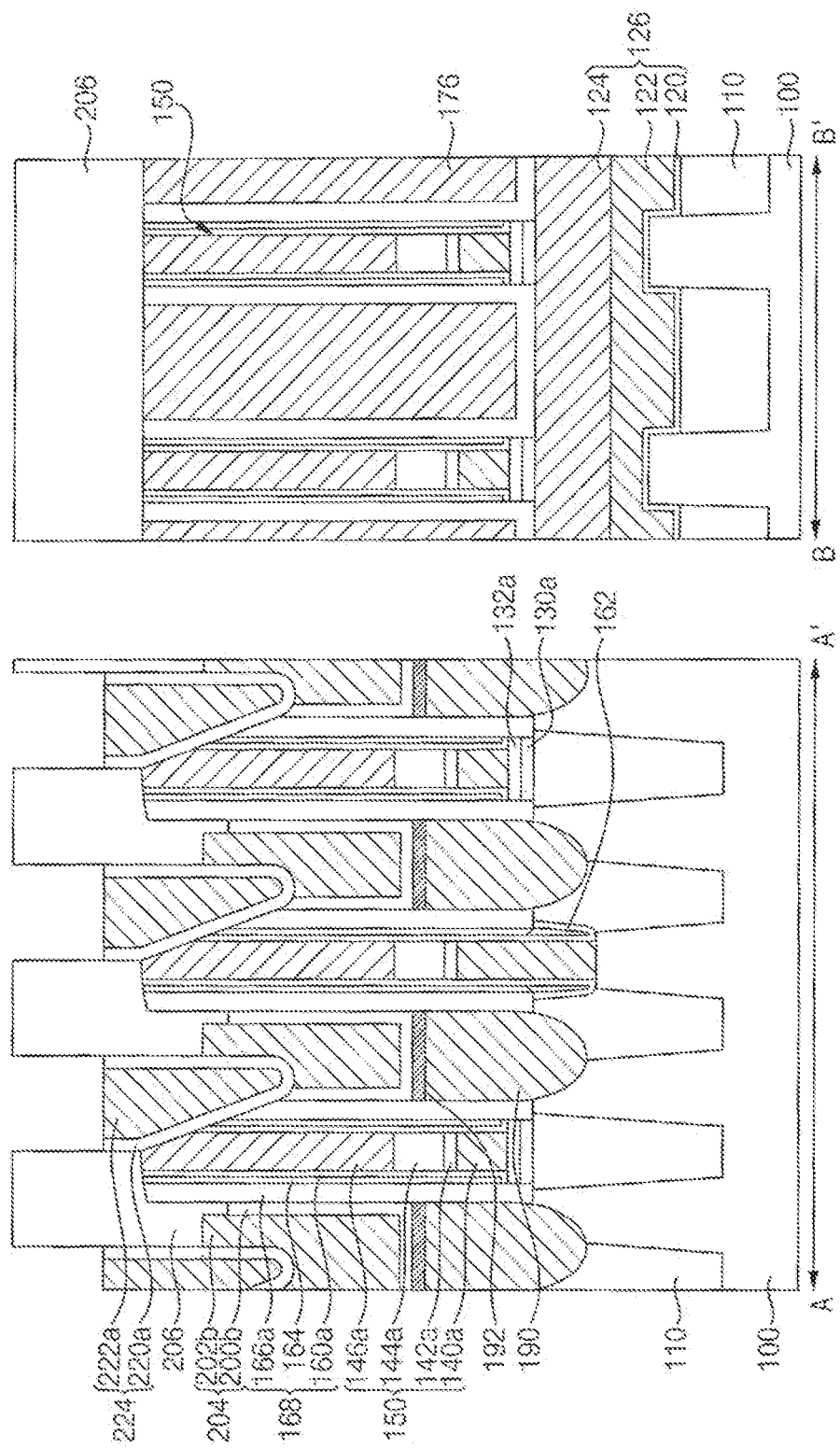

Referring to FIG. 24, the third metal layer 222 and the third barrier metal layer 220 formed on the sacrificial insulation layer 206 may be removed. Subsequently, the third metal layer 222 and the third barrier metal layer 220 formed in an upper portion of the fourth opening 210 may be removed. The removing process may include an etch-back process using a dry etching process.

When the etch-back process is performed, each of the third metal layer 222 and the third barrier metal layer 220 may be separated by the fourth opening 210 to form a third contact plug 224 including a third metal pattern 222a and a third barrier metal in the fourth opening 210.

An upper surface of the third contact plug 224 may be lower than an upper surface of the sacrificial insulation layer 206. The upper surface of the third contact plug 224 may be higher than the top surface of the bit line structure 150.

The third contact plug 224 may be formed on a portion of the second contact plug 204. The third contact plug 224 may at least fill the upper recess of the second contact plug 204. The third barrier metal pattern 220a may be formed on a surface of the upper recess of the second contact plug 204.

In example embodiments, a plurality of third contact plugs 224 may be formed to be spaced apart from each other in each of the first and second directions. In a plan view, the plurality of third contact plugs 224 may be arranged in a honeycomb structure. Also, each of the third contact plugs 224 may have a polygonal shape, a circular shape, or an oval shape, in the plan view.

A contact structure may include the first contact plug 190, the metal silicide pattern 192, the second contact plug 204, and the third contact plug 224 sequentially stacked. The upper surface of the third contact plug 224 may serve as a landing pad pattern for contacting a lower electrode in the capacitor.

The third contact plug 224 may contact the upper recess of the second contact plug 204. A lowermost surface of the third contact plug 224 may be lower than the top surface of the second contact plug 204.

The top surface of the second contact plug 204 may be lower than the top surface of the bit line structure 150. Also, the top surface of the second barrier metal pattern 200b included in the second contact plug 204 may be lower than the top surface of the second metal pattern 202b. Thus, a defect in which adjacent contact structures may be electrically connected to each other by the second barrier metal pattern 200b may be decreased.

A first sidewall of the third contact plug 224 contacting the first capping pattern 146a and the spacer structure 168 may have a gentle slope more than a second sidewall of the third contact plug 224 contacting the second contact plug 204. Thus, a distance between the first sidewall of the third contact plug 224 contacting the first capping pattern 146a and the spacer structure 168 and the second contact plug 204 adjacent thereto may be increased. Thus, a bridge defect between adjacent contact plug structures may be decreased.

Figure 25:
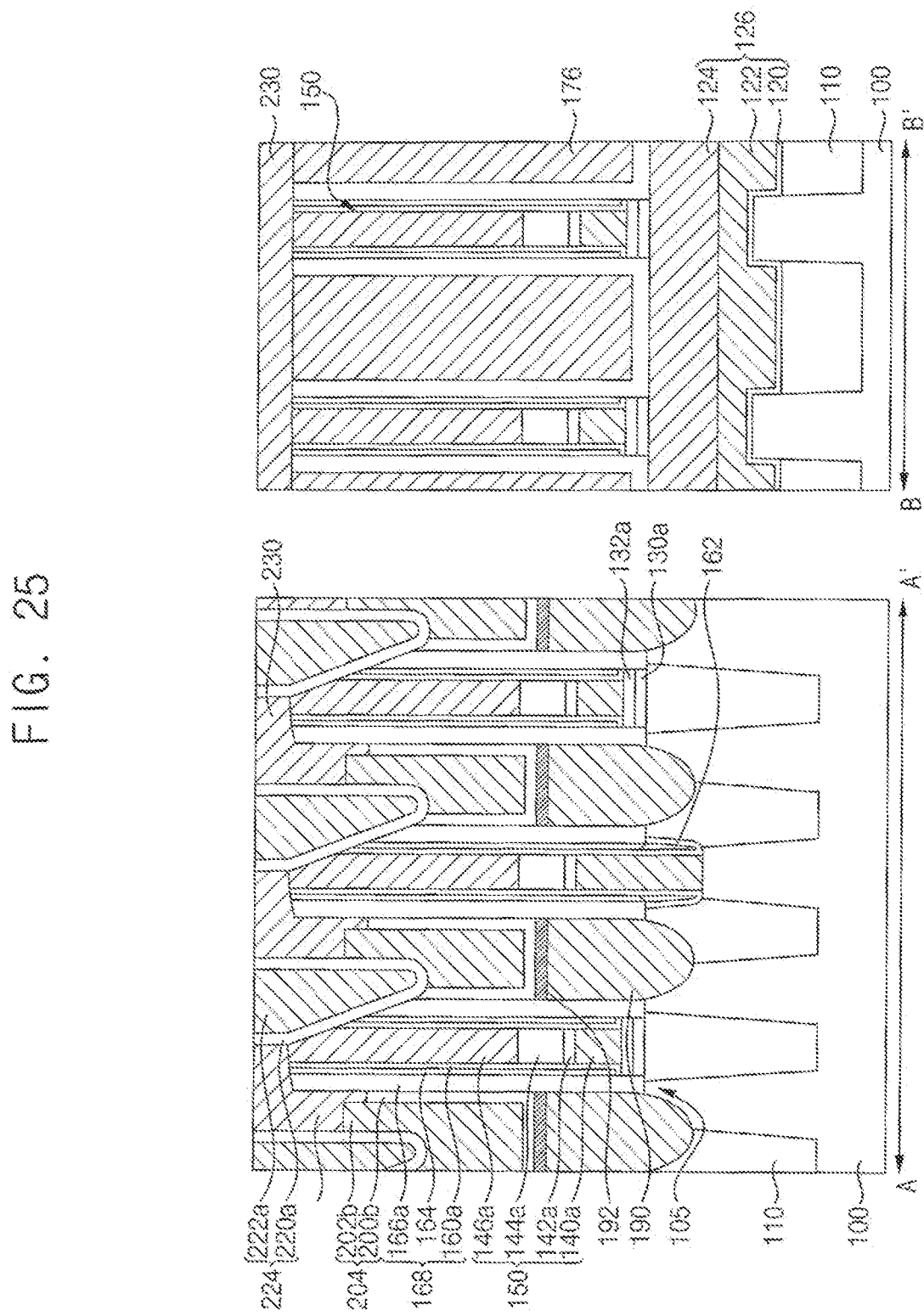

Referring to FIG. 25, the sacrificial insulation layer 206 may be removed. The removing process of the sacrificial insulation layer 206 may include a wet etching process.

A second insulating interlayer 230 may be formed to cover the spacer structure 168, the first capping pattern 146a, the second and third contact plugs 204 and 224, and the fence insulation pattern 176 exposed by removing the sacrificial insulation layer 206. The second insulating interlayer 230 may be formed to sufficiently fill a gap between the third contact plugs 224. Thereafter, the second insulating interlayer 230 may be planarized until the upper surface of the third contact plug 224 may be exposed.

The second insulating interlayer 230 may include, e.g., silicon nitride. The second insulating interlayer 230 and the fence insulation pattern 176 include the same material, so that the second insulating interlayer 230 and the fence insulation pattern 176 may be merged into one layer.

Figure 26:
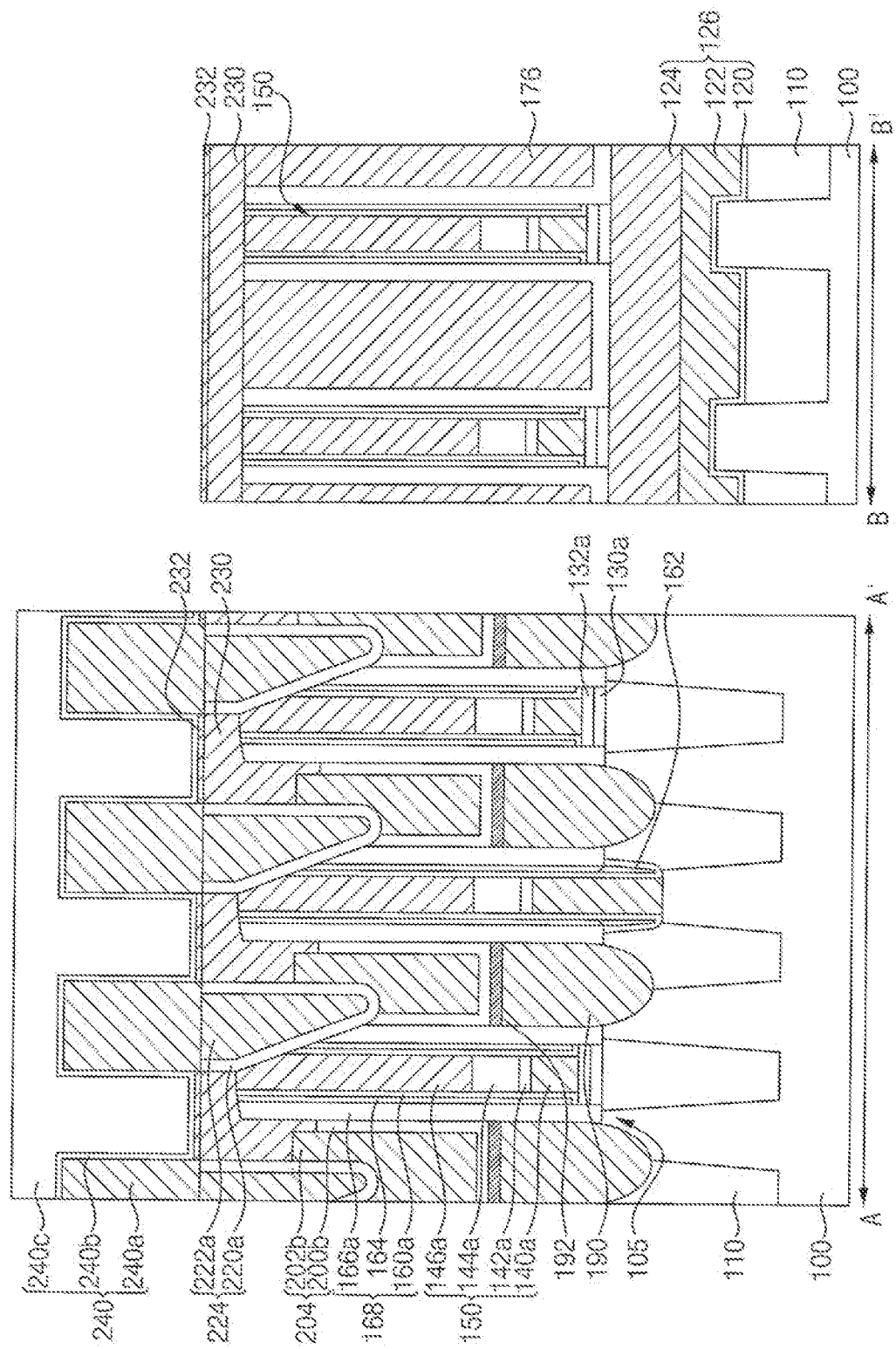

Referring to FIG. 26, an etch stop layer 232 may be formed on the second insulating interlayer 230 and the third contact plug 224. A capacitor 240 may be formed on the upper surface of the third contact plug 224 through the etch stop layer 232.

The capacitor 240 may include a lower electrode 240a, a dielectric layer 240b, and an upper electrode 240c stacked.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   bit line structures on a substrate;
   a contact plug structure on the substrate between the bit line structures, the contact plug structure including a first contact plug, a second contact plug, and a third contact plug sequentially stacked; and
   a capacitor electrically connected to the contact plug structure,
   wherein an upper surface of the second contact plug includes an upper recess,
   wherein the third contact plug fills the upper recess and protrudes above the upper recess, and an upper surface of the third contact plug is higher than a top surface of the bit line structures, and
   wherein the second contact plug includes a second barrier metal pattern comprising a first material and a second metal pattern comprising a second material different from the first material, the second barrier metal pattern being on and contacting sidewalls and a bottom of the second metal pattern.

2. The semiconductor device of claim 1,
   wherein an upper portion of each of the bit line structures includes a capping pattern including an insulation material, and
   wherein a first sidewall of the third contact plug contacts a sidewall of the capping pattern in the bit line structure.

3. The semiconductor device of claim 2, wherein the first sidewall of the third contact plug contacting the capping pattern has a smaller slope than a second sidewall of the third contact plug contacting the second contact plug with respect to an upper surface of the third contact plug.

4. The semiconductor device of claim 2, wherein in a portion lower than a top surface of the capping pattern, a width of the third contact plug is gradually decreased downward.

5. The semiconductor device of claim 1, wherein a top surface of the second contact plug is lower than the top surface of the bit line structures.

6. The semiconductor device of claim 1, wherein the first contact plug includes polysilicon, and the second contact plug and the third contact plug include a metal.

7. The semiconductor device of claim 1, wherein a top surface of the second barrier metal pattern is lower than a top surface of the second metal pattern.

8. The semiconductor device of claim 1, wherein the third contact plug includes a third barrier metal pattern and a third metal pattern, and the third barrier metal pattern is formed on sidewalls and a bottom of the third metal pattern.

9. The semiconductor device of claim 8, wherein the third barrier metal pattern is formed on a surface of the upper recess of the second contact plug.

10. The semiconductor device of claim 1, further comprising a metal silicide pattern between the first contact plug and the second contact plug.

11. The semiconductor device of claim 1, further comprising a spacer structure on sidewalls of the bit line structures.

12. The semiconductor device of claim 11, wherein the spacer structure comprises:
    a first spacer covering the sidewalls of the bit line structures;
    a second spacer covering an outer wall of the first spacer; and
    a third spacer covering an outer wall of the second spacer.

13. The semiconductor device of claim 11,
    wherein the third contact plug contacts an upper portion of the bit line structures and an upper portion of the spacer structure adjacent thereto, and
    wherein upper sidewalls of the bit line structures and the spacer structure contacting the third contact plug has a smaller slope than opposite upper sidewalls of the bit line structures and the spacer structure.

14. A semiconductor device, comprising:
    bit line structures on a substrate;
    a contact plug structure on the substrate between the bit line structures, the contact plug structure including a first contact plug including polysilicon, a second contact plug including a metal on the first contact plug, and a third contact plug including a metal on the second contact plug sequentially stacked; and
    a capacitor electrically connected to the contact plug structure, wherein a top surface of the second contact plug is lower than a top surface of the bit line structures,
    wherein an upper surface of the third contact plug is higher than the top surface of the bit line structures, and a lowermost surface of the third contact plug is lower than the top surface of the second contact plug,
    wherein a first sidewall of the third contact plug contacts a sidewall of a first bit line structure of the bit line structure,
    wherein the second contact plug includes a second barrier metal pattern comprising a first material and a second metal pattern comprising a second material different from the first material, the second barrier metal pattern being on and contacting sidewalls and a bottom of the second metal pattern, and
    wherein the third contact plug contacts the second barrier metal pattern and the second metal pattern.

15. The semiconductor device of claim 14, wherein the first sidewall of the third contact plug contacting the sidewall of the first bit line structure has a smaller slope than a second sidewall of the third contact plug contacting the second contact plug.

16. The semiconductor device of claim 14, further comprising a spacer structure on sidewalls of the first bit line structure.

17. The semiconductor device of claim 16,
    wherein the third contact plug contacts an upper portion of the first bit line structure and an upper portion of the spacer structure adjacent thereto, and wherein upper sidewalls of the first bit line structure and the spacer structure contacting the third contact plug has a smaller slope than opposite upper sidewalls of the first bit line structure and the spacer structure.

18. The semiconductor device of claim 14, wherein a top surface of the second barrier metal pattern is lower than a top surface of the second metal pattern.

19. A semiconductor device, comprising:
a substrate including an active pattern defined by an isolation pattern;
gate structures buried in the active pattern and the isolation pattern of the substrate;
bit line structures on the substrate;
a contact plug structure on the active pattern between the bit line structures, the contact plug structure including a first contact plug including polysilicon, a second contact plug including a metal on the first contact plug, and a third contact plug including a metal on the second contact plug sequentially stacked; and
a capacitor electrically connected to the contact plug structure,
wherein the second contact plug includes a second barrier metal pattern comprising a first material and a second metal pattern comprising a second material different from the first material, the second barrier metal pattern being on and contacting sidewalls and a bottom of the second metal pattern,
wherein the third contact plug contacts a sidewall of a first bit line structure of the bit line structures and upper surfaces of the second barrier metal pattern and the second metal pattern of the second contact plug, and
wherein both sidewalls of the third contact plug have slopes different from each other, in a cross-sectional view.

20. The semiconductor device of claim 1, wherein the third contact plug contacts the second barrier metal pattern and the second metal pattern.

* * * * *